(12) United States Patent
Sano

(10) Patent No.: US 8,704,192 B2
(45) Date of Patent: Apr. 22, 2014

(54) DRAWING APPARATUS AND METHOD OF MANUFACTURING ARTICLE

(75) Inventor: Kentaro Sano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/471,322

(22) Filed: May 14, 2012

(65) Prior Publication Data

US 2012/0295203 A1 Nov. 22, 2012

(30) Foreign Application Priority Data

May 16, 2011 (JP) .................................. 2011-109449

(51) Int. Cl.
*G21K 5/04* (2006.01)
(52) U.S. Cl.
USPC .................. 250/396 R; 250/492.1; 250/492.3
(58) Field of Classification Search
USPC .................. 250/492.1, 492.2, 492.21, 492.22, 250/492.3, 396 R, 397, 398, 396 ML
See application file for complete search history.

(56) References Cited

U.S. PATENT DOCUMENTS

| | | | | |
|---|---|---|---|---|
| 2002/0148961 | A1* | 10/2002 | Nakasuji et al. | 250/311 |
| 2011/0069862 | A1* | 3/2011 | Krizek et al. | 382/100 |
| 2012/0241641 | A1* | 9/2012 | Sano et al. | 250/396 R |
| 2012/0295202 | A1* | 11/2012 | Sano | 430/296 |

FOREIGN PATENT DOCUMENTS

| | | |
|---|---|---|
| JP | 9007538 A | 1/1997 |
| JP | 3803105 B2 | 8/2006 |

* cited by examiner

*Primary Examiner* — Nicole Ippolito
(74) *Attorney, Agent, or Firm* — Canon U.S.A., Inc. IP Division

(57) ABSTRACT

A drawing apparatus includes an aperture array, a lens array configured to form a plurality of crossovers of a plurality of charged particle beams from the aperture array, and a projection system including an element having a single aperture and configured to converge the plurality of charged particle beams corresponding to the plurality of crossovers and to project the plurality of charged particle beams having passed through the single aperture onto the substrate. The lens array includes a correction lens array including a converging lens eccentric relative to corresponding one of a plurality of apertures of the aperture array such that the plurality of charged particle beams converged according to aberration of the projection system are converged to the single aperture. The lens array includes a magnifying lens array configured, so as to form the plurality of crossovers, to magnify a plurality of crossovers formed by the correction lens array.

14 Claims, 19 Drawing Sheets

APERTURE ARRANGEMENT
OF CORRECTION LENS ARRAY

APERTURE ARRANGEMENT
OF MAGNIFYING LENS ARRAY

APERTURE ARRANGEMENT
OF CORRECTION LENS ARRAY

APERTURE ARRANGEMENT
OF MAGNIFYING LENS ARRAY

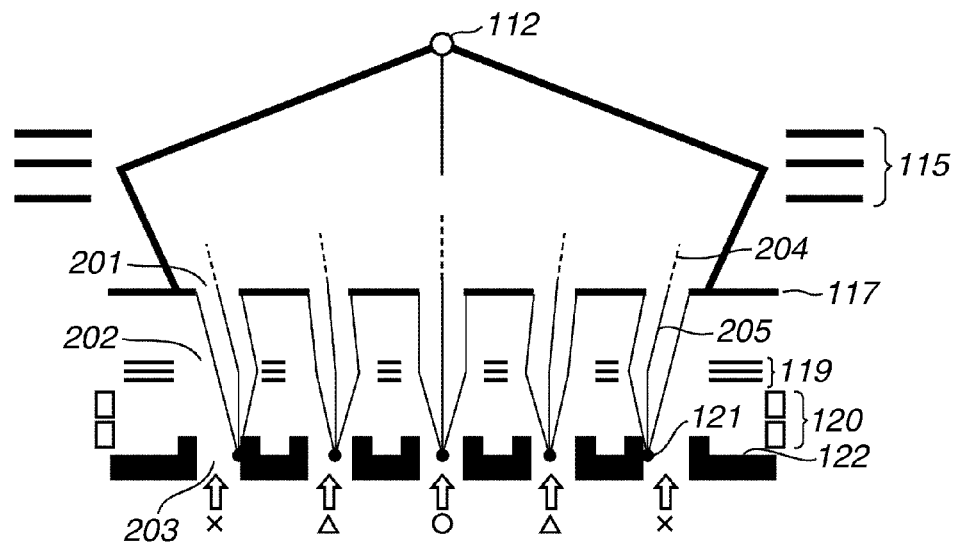
FIG.9A
FIG.9B
APERTURE ARRANGEMENTS OF APERTURE ARRAY AND CONVERGING LENS ARRAY
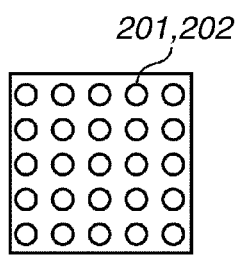
FIG.9C
BEAM ARRANGEMENT ON IMAGING PLANE
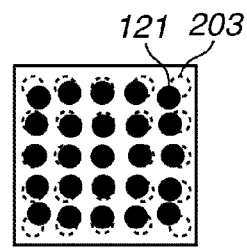
○ APERTURE ARRANGEMENT OF BLANKER ARRAY
● ACTUAL BEAM ARRANGEMENT

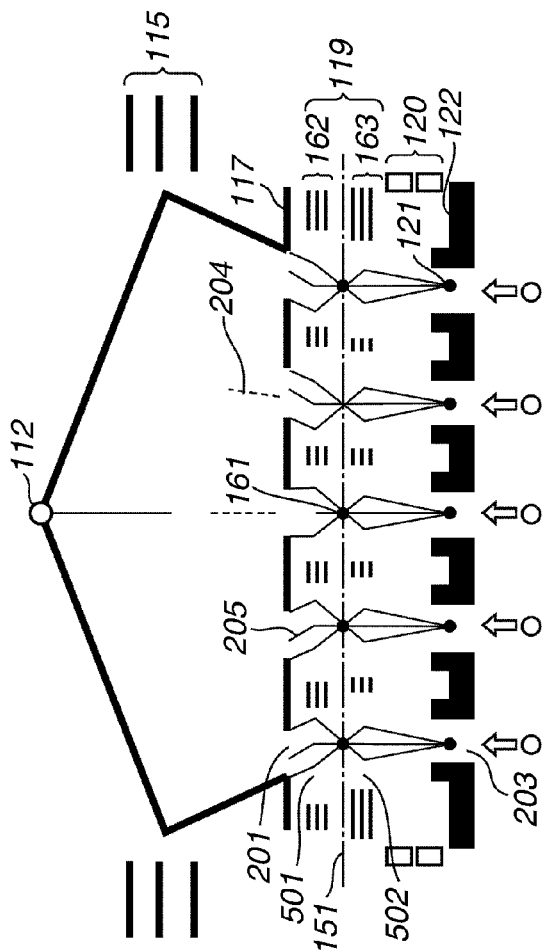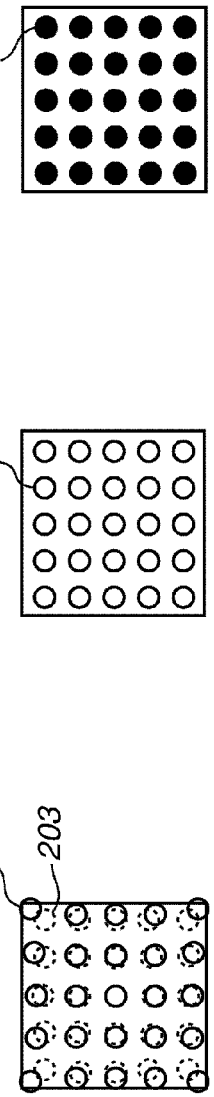

FIG.14A
APERTURE ARRANGEMENTS OF APERTURE ARRAY AND CORRECTION LENS ARRAY IN CASE WHERE DEFOCUS ADJUSTMENT IS NOT MADE

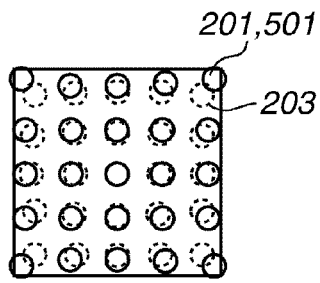

FIG.14B
APERTURE ARRANGEMENTS OF APERTURE ARRAY AND CORRECTION LENS ARRAY IN CASE WHERE DEFOCUS ADJUSTMENT IS MADE

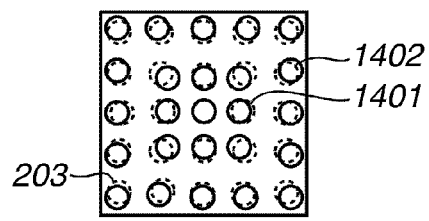

FIG.14C

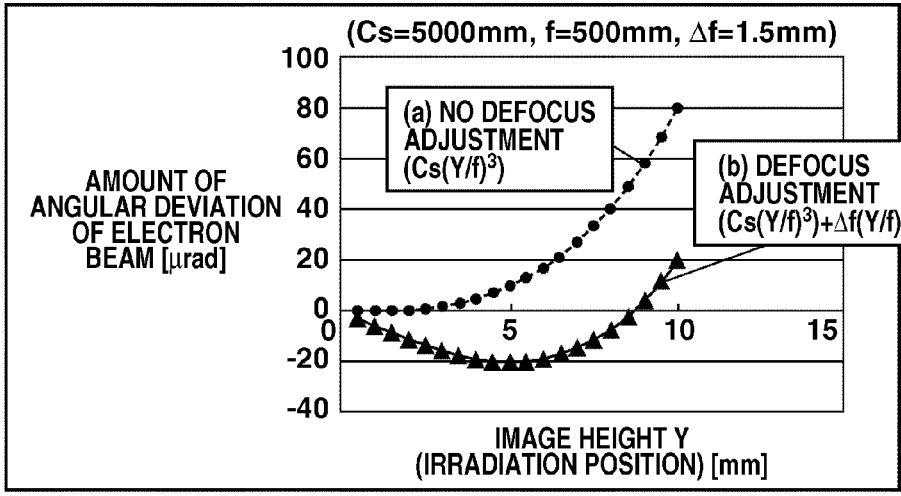

Cs=Cs(CO-adj)+Cs(CL)+Cs(Coulomb)

Cs(CO-adj): SPHERICAL ABERRATION (POSITIVE) OF CROSSOVER-ADJUSTMENT OPTICAL SYSTEM
Cs(CL): SPHERICAL ABERRATION (POSITIVE) OF COLLIMATOR LENS
Cs(Coulomb): SPHERICAL ABERRATION (NEGATIVE) OF SPACE-CHARGE EFFECT

FIG.16A
APERTURE ARRANGEMENTS
OF APERTURE ARRAY AND
CORRECTION LENS ARRAY
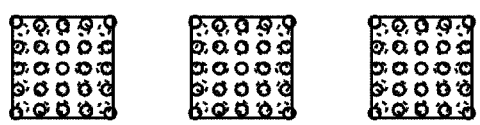
201,501
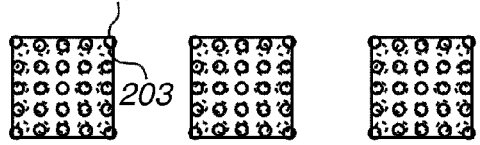
203
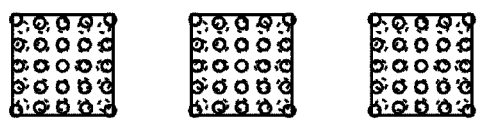
FIG.16B
APERTURE ARRANGEMENT
OF MAGNIFYING LENS ARRAY
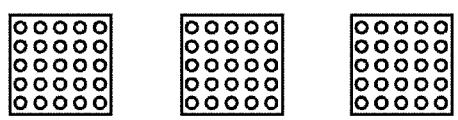
502,203
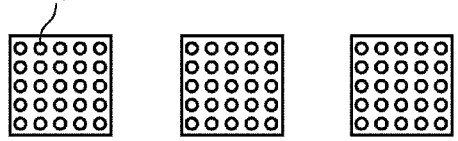
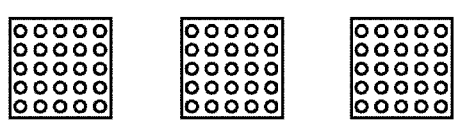
FIG.16C
BEAM ARRANGEMENT
ON IMAGING PLANE
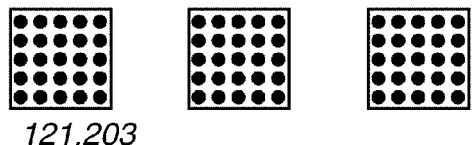
121,203
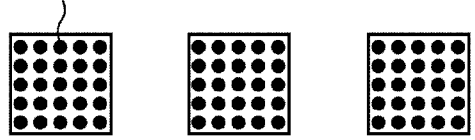

APERTURE ARRANGEMENTS
OF APERTURE ARRAY AND
CONVERGING LENS ARRAY

BEAM ARRANGEMENT
ON IMAGING PLANE
(STOP APERTURE ARRAY)

APERTURE
ARRANGEMENTS OF
APERTURE ARRAY
AND CORRECTION
LENS ARRAY

APERTURE
ARRANGEMENT
OF MAGNIFYING
LENS ARRAY

BEAM ARRANGEMENT
ON IMAGING PLANE
(STOP APERTURE ARRAY)

DRAWING APPARATUS AND METHOD OF MANUFACTURING ARTICLE

BACKGROUND OF THE INVENTION

1. Field of the Invention

Embodiments of the present invention relate to a drawing apparatus configured to perform drawing on a substrate with a plurality of charged particle beams.

2. Description of the Related Art

In a drawing apparatus configured to perform drawing on a substrate with a plurality of charged particle beams, non-uniformity in characteristic among the plurality of charged particle beams becomes an issue. As this non-uniformity, specifically, a locational error or angular error of each charged particle beam, and the like can be exemplified. This non-uniformity is disadvantageous in terms of the overlay accuracy of the drawing apparatus.

As a method of compensating for the corresponding non-uniformity, there is a method discussed in Japanese Patent No. 3803105. This method shifts the position of each aperture of an aperture array or a lens array, which is in front of a projection optical system, according to the aberration of the projection optical system, thereby intentionally making non-uniformity in the positions and angles of charged particle beams entering the projection optical system. Further, the shift amount of each aperture of the aperture array and the lens array is determined such that the corresponding non-uniformity negates non-uniformity among the plurality of charged particle beams occurring by the aberration of the rear-side projection optical system. In this way, the final non-uniformity among the plurality of charged particle beams is compensated for.

However, the shift amount of each aperture is limited. This limit will be described with reference to FIG. 3. In a case where an amount of aberration of a rear-side projection lens 125 is large, and a shift amount of each aperture 201 which is to be given on the front side of the projection lens 125 is large, as illustrated in FIG. 3, some charged particle beams are reflected at a converging lens array 119. In other words, compensation that is made by shifting the apertures 201 is limited according to vignetting at the converging lens array 119, and can be made only within a range that is not limited by the corresponding vignetting.

In the case of compensating for not only non-uniformity according to aberration of a projection system but also non-uniformity according to aberration of an optical system (charged-particle optical system) by shifting apertures, there is a compensation limit according to vignetting of charged particle beams at an optical element. However, any method of solving the issue of the compensation limit has not been discussed.

SUMMARY OF THE INVENTION

The present invention is directed to, for example, a drawing apparatus which is advantageous in compensating for non-uniformity among a plurality of charged particle beams.

According to an aspect of the present invention, a drawing apparatus configured to perform drawing on a substrate with a plurality of charged particle beams includes, for example, an irradiation system including a collimator lens on which a diverging charged particle beam is incident, an aperture array configured to split the charged particle beam from the collimator lens into a plurality of charged particle beams, a lens array configured to form a plurality of crossovers of the plurality of charged particle beams from the aperture array, and a projection system including an element having a single aperture and configured to converge a plurality of charged particle beams corresponding to the plurality of crossovers and to project the plurality of charged particle beams having passed through the single aperture onto the substrate. In the drawing apparatus, the lens array includes a correction lens array and a magnifying lens array, the correction lens array including a converging lens eccentric relative to corresponding one of a plurality of apertures of the aperture array such that the plurality of charged particle beams converged according to aberration of the projection system are converged to the single aperture, and the magnifying lens array configured, so as to form the plurality of crossovers, to magnify a plurality of crossovers formed by the correction lens array.

According to another aspect of the present invention, it is possible to provide a drawing apparatus advantageous, for example, in compensating for non-uniformity among a plurality of charged particle beams.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 9A, 9B, and 9C are diagrams illustrating charged particle beams passing through an aperture array and a converging lens array in a case where irradiation angles are non-uniform.

FIGS. 10A, 10B, 10C, and 10D are diagrams illustrating the configuration for compensating for non-uniformity among a plurality of charged particle beams according to aberration of an irradiation system according to the third exemplary embodiment.

FIGS. 14A, 14B, and 14C are diagrams illustrating differences in aperture arrangements of an aperture array and a correction lens array between a case where defocus adjustment of a collimator lens is made and a case where defocus adjustment of the collimator lens is not made.

FIGS. 16A, 16B, and 16C are diagrams illustrating aperture arrangements of an aperture array and a correction lens array, and an arrangement of charged particle beams on an imaging plane.

DESCRIPTION OF THE EMBODIMENTS

Various exemplary embodiments, features, and aspects of the invention will be described in detail below with reference to the drawings.

Figure 1:
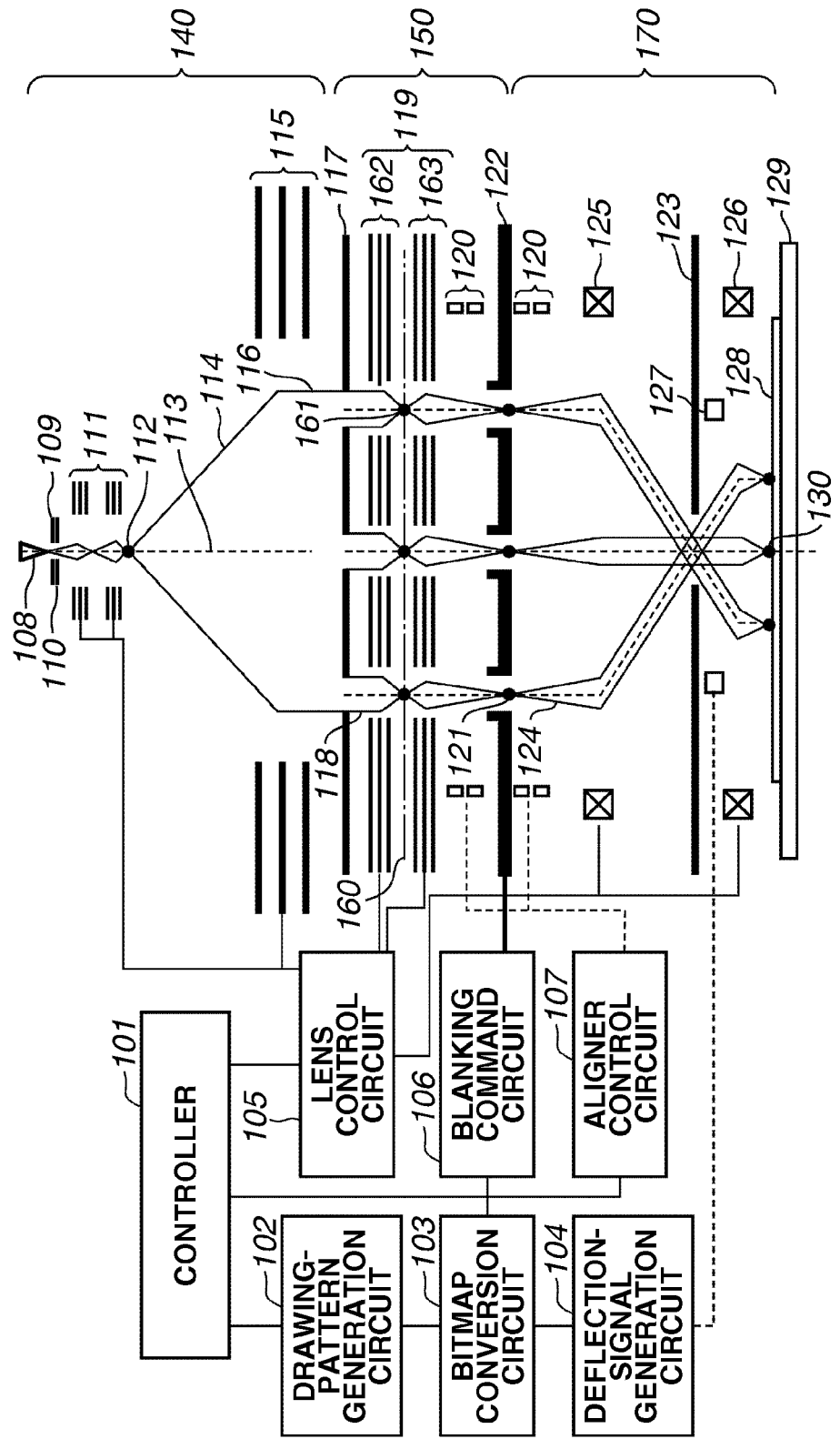
FIG. 1 is a diagram illustrating the configuration of a drawing apparatus according to a first exemplary embodiment.

FIG. 1 is a diagram illustrating the configuration of a drawing apparatus (drawing apparatus configured to perform drawing on a substrate with a plurality of charged particle beams) according to a first exemplary embodiment. The drawing apparatus of the present exemplary embodiment is configured to include one projection system for the plurality of charged particle beams and collectively reduce the plurality of charged particle beams and project the plurality of charged particle beams onto a wafer (substrate) by the projection system. Throughout all exemplary embodiments, examples using electron rays (electron beams) as charged particle beams will be described. However, the present invention is not limited thereto, but other charged particle beams such as ion beams may be used.

In FIG. 1, an electron beam from an electron source 108 is adjusted by a Wehnelt electrode 109 and is drawn by an anode electrode 110. The electron beam forms a (irradiation optical system) crossover 112 by a crossover-adjustment optical system 111 (also referred to as a crossover adjusting system). Here, the electron source 108 may be a thermionic-type electron source having an electron emission unit including LaB6 or BaO/W (dispenser cathode), or the like. A crossover-adjustment optical system 111 is composed of electrostatic lenses of two stages, each electrostatic lens may be an einzel-type electrostatic lens that is composed of three electrodes in which the intermediate electrode is configured to receive a negative potential, and the upper and lower electrodes are configured to be grounded. An electron beam radiating at a wide angle from the crossover 112 is collimated by a collimator lens 115, and is irradiated onto an aperture array 117.

The collimated beam emitted from the collimator lens and irradiated onto the aperture array 117 is split into multiple electron beams 118 (a plurality of electron beams) by the aperture array 117. Each of the multiple electron beams 118 is converged by a converging lens array 119 to form an image (a crossover) on a blanker array 122 (blanking deflector array). Here, the converging lens array 119 is composed of electrostatic lens arrays of two stages, and each of a correction lens array 162 of the first stage and a magnifying lens array 163 of the second stage is composed of three porous electrodes. Each of the correction lens array 162 and the magnifying lens array 163 may be an einzel-type electrostatic lens array composed of three electrodes in which the intermediate electrode is configured to receive a negative potential and the upper and lower electrodes are configured to be grounded. Also, in order to enable the aperture array 117 to define passing areas of electron beams at a pupil surface of the converging lens array 119, the aperture array 117 is disposed at the position of a pupil surface of the correction lens array 162 (the position of the front focal plane of the correction lens array 162).

The blanker array 122 is a device having a pair of deflecting electrodes for each electron beam. The blanker array 122 performs blanking on each of the plurality of electron beams based on a blanking signal generated through a drawing-pattern generation circuit 102, a bitmap conversion circuit 103, and a blanking command circuit 106. Electron beams 124 deflected by the blanker array 122 are blocked by a rear-side stop aperture array 123, resulting in a blanking state.

The multiple electron beams having passed through the blanker array 122 are converged substantially at the center position of a single aperture on the stop aperture array 123 by a first projection lens 125. Further, each of the multiple electron beams is converged by a second projection lens 126, such that a pattern of the multiple electron beams on an intermediate imaging plane on the blanker array 122 is reduced and projected onto a wafer 128. Here, each of the first projection lens 125 and the second projection lens 126 is composed of magnetic field lenses, and these magnetic field lenses constitute a doublet lens. A projection magnification of a projection system including the first projection lens 125 and the second projection lens 126 may be set to about 1/100 times. Therefore, for example, if the full width at half maximum (FWHM) of the electron beams on the intermediate imaging plane of the blanker array 122 is 2 μm, the FWHM of the electron beams on the wafer 128 becomes about 20 nm.

An electron optical system includes an irradiation optical system 140 (also referred to as an irradiation system), an optical system 150 for forming multiple electron beams (also referred to as a multi-beam forming system), and a projection optical system 170 (also referred to as a projection system). The irradiation optical system 140 includes from the electron source 108 to the collimator lens 115, and forms a collimated beam and irradiates the collimated beam onto the aperture array 117. The optical system 150 for forming multiple electron beams splits the electron beam irradiated by the irradiation optical system 140 into multiple electron beams, and forms a plurality of crossovers. The projection optical system 170 reduces the plurality of crossovers formed by the optical system 150 for forming multiple electron beams, and projects the plurality of crossovers onto the wafer 128. The present exemplary embodiment relates particularly to a configuration of the optical system 150 for forming multiple electron beams.

Scanning the wafer with the multiple electron beams can be performed by a deflector 127. The deflector 127 is an eight-pole electrostatic deflector and can operate at a higher speed than a magnetic deflector can do. The deflector 127 is driven according to a signal from a deflection-signal generation circuit 104. During drawing of a pattern, the wafer 133 continuously moves in an X direction (direction perpendicular to the paper plane of FIG. 1) according to movement of a stage 129. In parallel with this, based on the result of the measurement of the position of the stage 129 by a laser length measuring machine (not illustrated), electron beams 130 on the wafer are deflected in a Y direction (left and right direction on the paper plane of FIG. 1) by the deflector 127. Further, in parallel with those, the multiple electron beams are individually blanked by the blanker array 122 and the stop aperture array 123 according to the drawing pattern. In this way, it is possible to perform drawing on the wafer 128 at a high speed.

Figure 2:
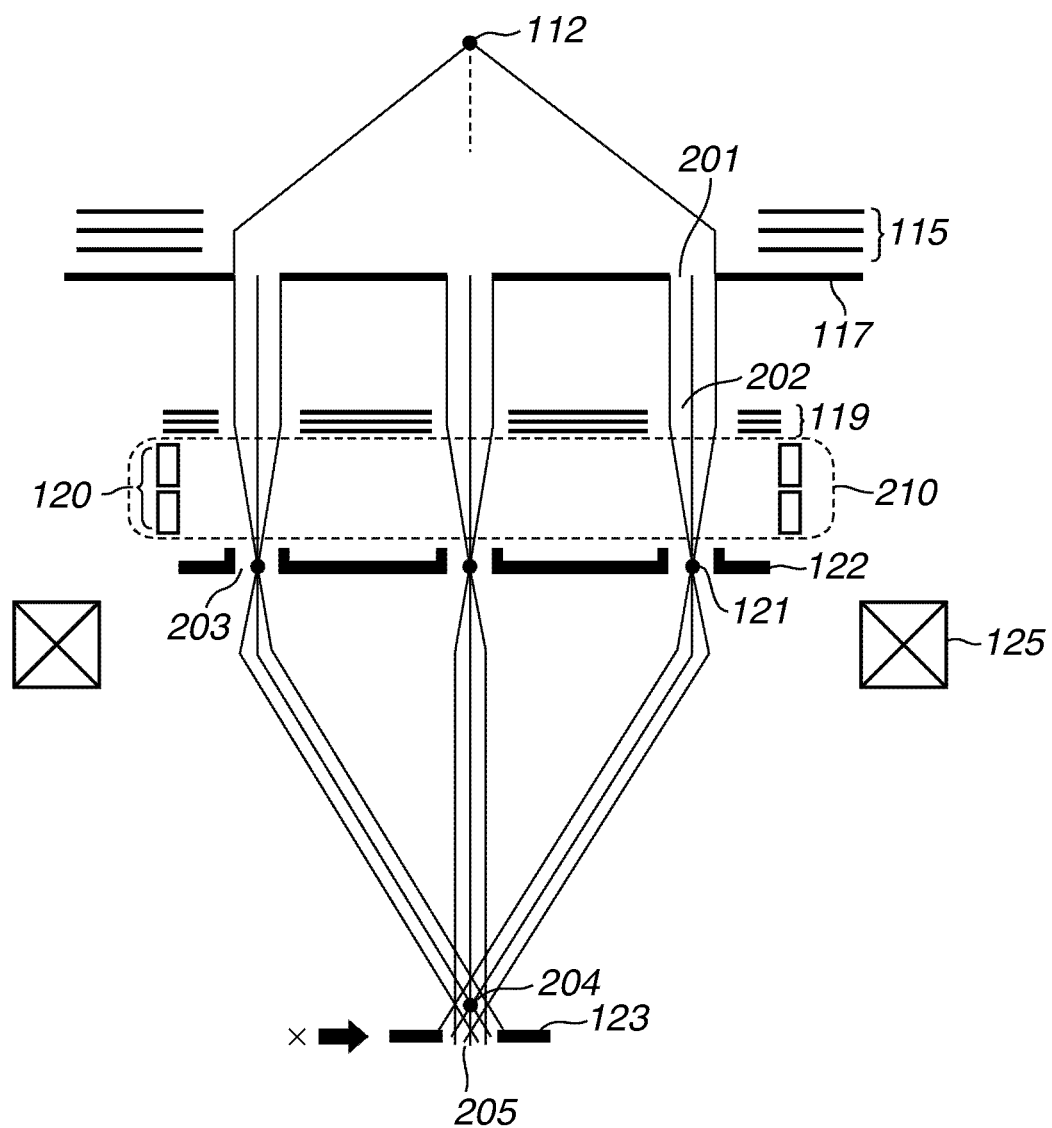
FIG. 2 is a diagram illustrating non-uniformity among a plurality of charged particle beams according to aberration of a projection system.

FIG. 2 is a view illustrating non-uniformity among the multiple electron beams according to the aberration of the projection system in a case where the present exemplary embodiment is not applied. The electron beams, which are supposed to reach the center of an aperture 205 of the stop aperture array if the projection system has no aberration, are more greatly shifted to an electrode source side as they are more outside if the projection system has aberration (spherical aberration), as illustrated in FIG. 2. Here, a point 204 illustrated in FIG. 2 is an intersection of principal rays of two outside electron beams. Like this, the more outside electron beam is converged at a position, the more greatly it deviates to the electron source side. Therefore, it is impossible to converge all of the multiple electron beams at the center of the aperture 205 of the stop aperture array 123. As a result, non-uniformity occurs in landing angles and landing characteristics on the wafer surface.

One solution to this is a method discussed in Japanese Patent No. 3803105. According to this solution, if the positions of apertures 202 of the converging lens array are shifted with respect to apertures 201 of an aperture array, outside electron beams can be inclined outwardly and enter the projection system. Therefore, the outside electron beams can also reach the center of the apertures 205 of the stop aperture array. However, the method discussed in Japanese Patent No. 3803105 has a compensation limit during compensation on the aberration of the projection system, and thus cannot perform compensation beyond the limit.

Figure 3:
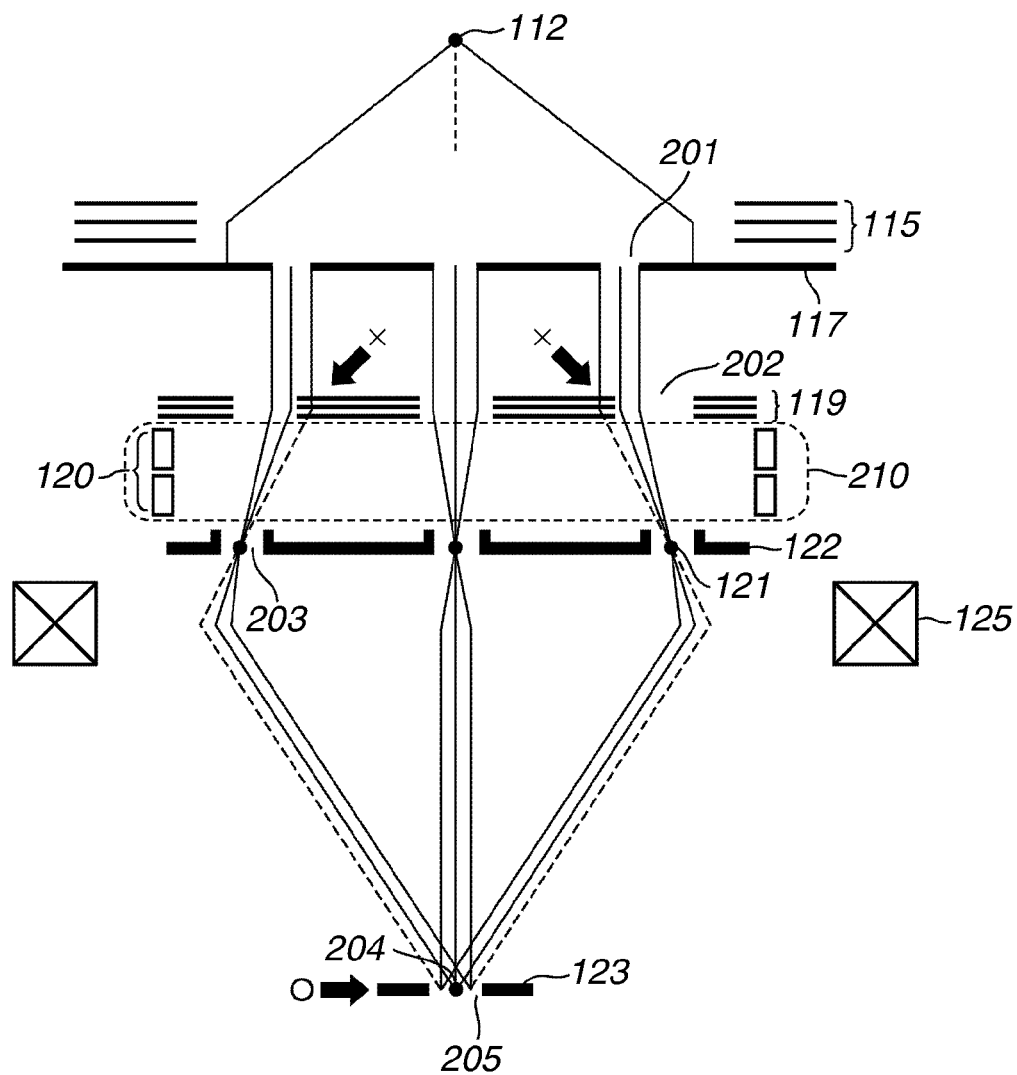
FIG. 3 is a diagram illustrating a compensation limit according to vignetting at a lens array.

FIG. 3 is a view illustrating the compensation limit. In a case where the aberration of the projection system is large, it is necessary to incline the outside electron beams outwardly at larger angles. To this end, it is necessary to increase the shift amounts of the apertures 202 of the converging lens array. However, in this case, as illustrated in FIG. 3, in the outside electron beams, vignetting occurs by the converging lens array 119. In other words, according to the method discussed in Japanese Patent No. 3803105, aberration compensation is possible only within a range in which vignetting of electron beams does not occur by the converging lens array 119.

Figure 4:
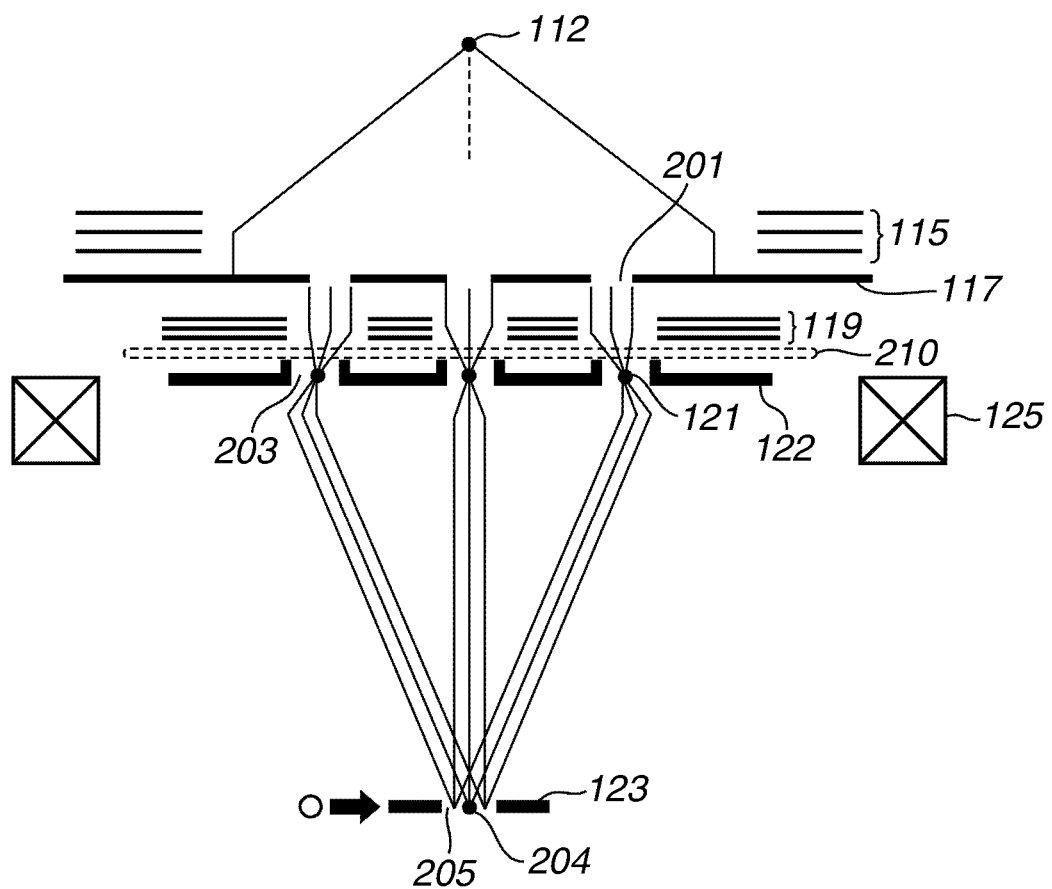
FIG. 4 is a diagram illustrating the configuration for reducing the focal length of the lens array to improve the compensation limit, and its issues.

FIG. 4 is a view illustrating a configuration in which the focal length of the lens array is set to be short for improving the compensation limit, and its issue. The compensation limit according to vignetting at the converging lens array 119 is inversely proportional to the focal length of the converging lens array 119. Therefore, if the focal length of the converging lens array 119 is set to be short (accordingly to this, a distance between the aperture array 117 and the converging lens array 119 is set to be short) as illustrated in FIG. 4, it is possible to improve the compensation limit. However, the following two constraints make it difficult to reduce the focal length of the converging lens array 119.

The first constraint is that an installation space 210 for an aligner deflector 120 configured to align the relative positions of the blanker array 122 and electron beams on the blanker array is necessary. Here, the aligner deflector 120 is a deflector configured to collectively deflect a plurality of charged particle beams between the converging lens array 119 and a plurality of crossovers formed by the converging lens array 119, thereby adjusting the positions of the plurality of crossovers. As illustrated in FIG. 4, in a case where the focal length of the converging lens array 119 is short, the installation space 210 for the aligner deflector becomes very narrow, and thus it is impossible to install the aligner deflector 120. As a result, it becomes impossible to ensure the relative positions of the blanker array 122 and the electron beams on the blanker array.

The second constraint is that it is impossible to set convergent angles of electron beams forming images on the blanker array 122 to be large. The deflection angles of the electron beams by the blanker array 122 are determined by the convergent angles of the electron beams forming images on the blanker array 122. For this reason, as the convergent angles increase, the deflection angles required of the blanker array 122 increase. Here, the convergent angles of the electron beams on the blanker array 122 are inversely proportional to the focal length of the converging lens array 119. Therefore, in a case where the focal length of the converging lens array 119 is set to be short, the convergent angles become large.

In short, in a case where the focal length of the converging lens array 119 is set to be short for improving the compensation limit, at least one of a point that it is impossible to secure an installation space for the aligner deflector and a point that the deflection angles required for blanking increase should be noted.

Figure 5A:
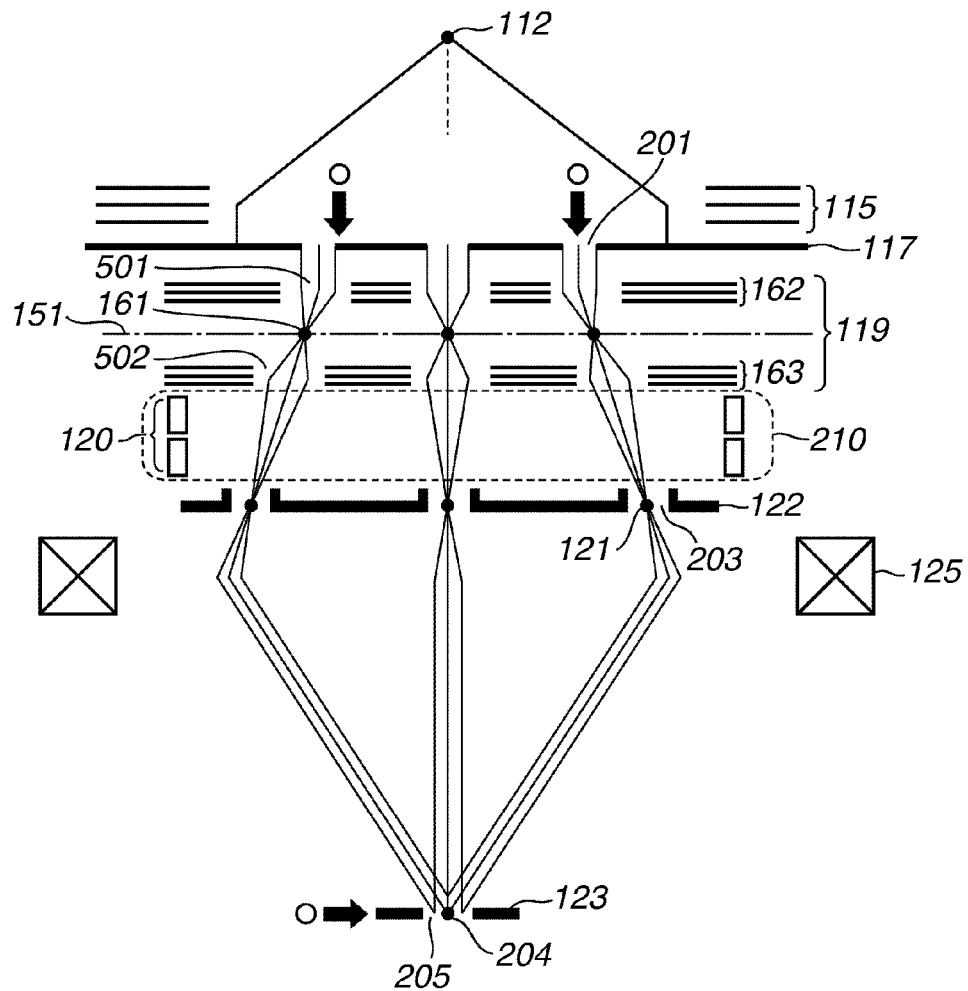
FIGS. 5A, 5B, and 5C are diagrams illustrating the configuration for compensating for non-uniformity among the plurality of charged particle beams according to the aberration of the projection system according to the first exemplary embodiment.
Figure 5B:
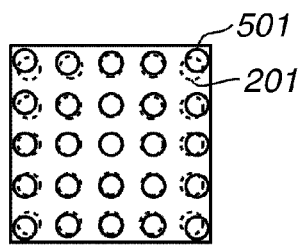
Figure 5C:
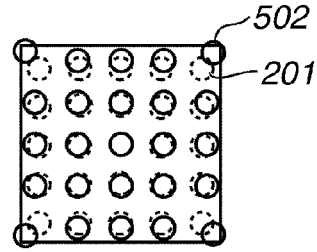

With respect to this, in the present exemplary embodiment, the converging lens array 119 is composed of converging lens arrays of two stages which are different from each other in their aperture arrangements, for improving the compensation limit. FIGS. 5A to 5C are diagrams illustrating the configuration according to the first exemplary embodiment for compensating for non-uniformity among the multiple electron beams according to the aberration of the projection system. The feature units and their effects according to the present exemplary embodiment will be described without describing the same features as those of the configuration discussed in Japanese Patent No. 3803105.

The configuration according to the present exemplary embodiment is different from the configuration illustrated in FIG. 3 in that the converging lens array 119 is composed of the correction lens array 162 and the magnifying lens array 163 of two stages, and in their aperture arrangements. The function of the two lens arrays will be described below.

First, similar to the converging lens array 119 having the short focal length in the configuration illustrated in FIG. 4, the correction lens array 162 has a function of compensating for non-uniformity among the multiple electron beams according to the aberration of the projection system. The compensation is made by shifting apertures 501 of the correction lens array with respect to the apertures 201 of the aperture array. Here, the shift amounts for the apertures 501 of the correction lens array are adjusted such that a more outside electron beam is more greatly inclined outwardly and enters the projection system. The focal length of the correction lens array 162 is set to be short such that a necessary compensation limit can be obtained.

The magnifying lens array 163 is a lens array for magnifying electron beams 161 forming images on a first imaging plane 151 by the correction lens array 162 without changing the angles of their principal rays. As can be seen from FIG. 5A, the arrangement of apertures 502 of the magnifying lens array 163 is made such that the principal rays of the individual electron beams pass the center positions of the apertures (lenses) to prevent the angles of the principal rays of the electron beams from changing. It is important to perform magnifying without changes in the angles of the principal rays to solve the issue described with reference to FIG. 4. The issue that it is impossible to secure an installation space for the aligner deflector is solved by lengthening a distance between the electrostatic lens array 119 and the blanker array 122 by the magnifying lens array 162. Further, the issue that the convergent angles of the electron beams on the blanker array 122 become large is solved by magnifying the electron beams 161 on the first imaging plane. Here, as apparent even from FIG. 5A, the convergent angles of the electron beams on the blanker array 122 are inversely proportional to the magnification (imaging magnification larger than 1 time).

In short, the converging lens array 119 having the two-stage configuration as described above can improve the compensation limit while avoiding the difficulties according to the constraints as described with reference to FIG. 4.

FIG. 5B illustrates the arrangement of the apertures 501 of the correction lens array by solid lines, and illustrates the arrangement of the apertures 201 of the aperture array by dotted lines. The position of the apertures 501 of the correction lens array are set such that a more outside aperture is more greatly deviated outwardly from the position of a corresponding aperture 201 of the aperture array. As a result, a more outside aperture more greatly inclines a corresponding principal ray outwardly.

FIG. 5C illustrates the apertures 502 of the magnifying lens array by solid lines, and illustrates the apertures 201 of the aperture array by dotted lines. The positions of the apertures 502 of the magnifying lens array are deviated from the apertures 201 of the aperture array such that principal rays of electron beams bended by the correction lens array 162 pass the center positions of corresponding apertures 502. Since a principal ray of a more outside electron beam is more greatly inclined outwardly, in FIG. 5A, the shift amounts of the apertures 502 of the magnifying lens array are set to be greater than the shift amounts of the apertures 501 of the correction lens array.

If aperture arrangements different from each other as illustrated in FIGS. 5B and 5C are used, it is possible to improve the compensation limit. The technical feature of the present exemplary embodiment is that lens arrays having two functions as described above are used together. Therefore, for example, at least one of the correction lens array 162 and the magnifying lens array 163 may be composed of a multi-stage lens array, so as to produce the same effect.

Figure 6:
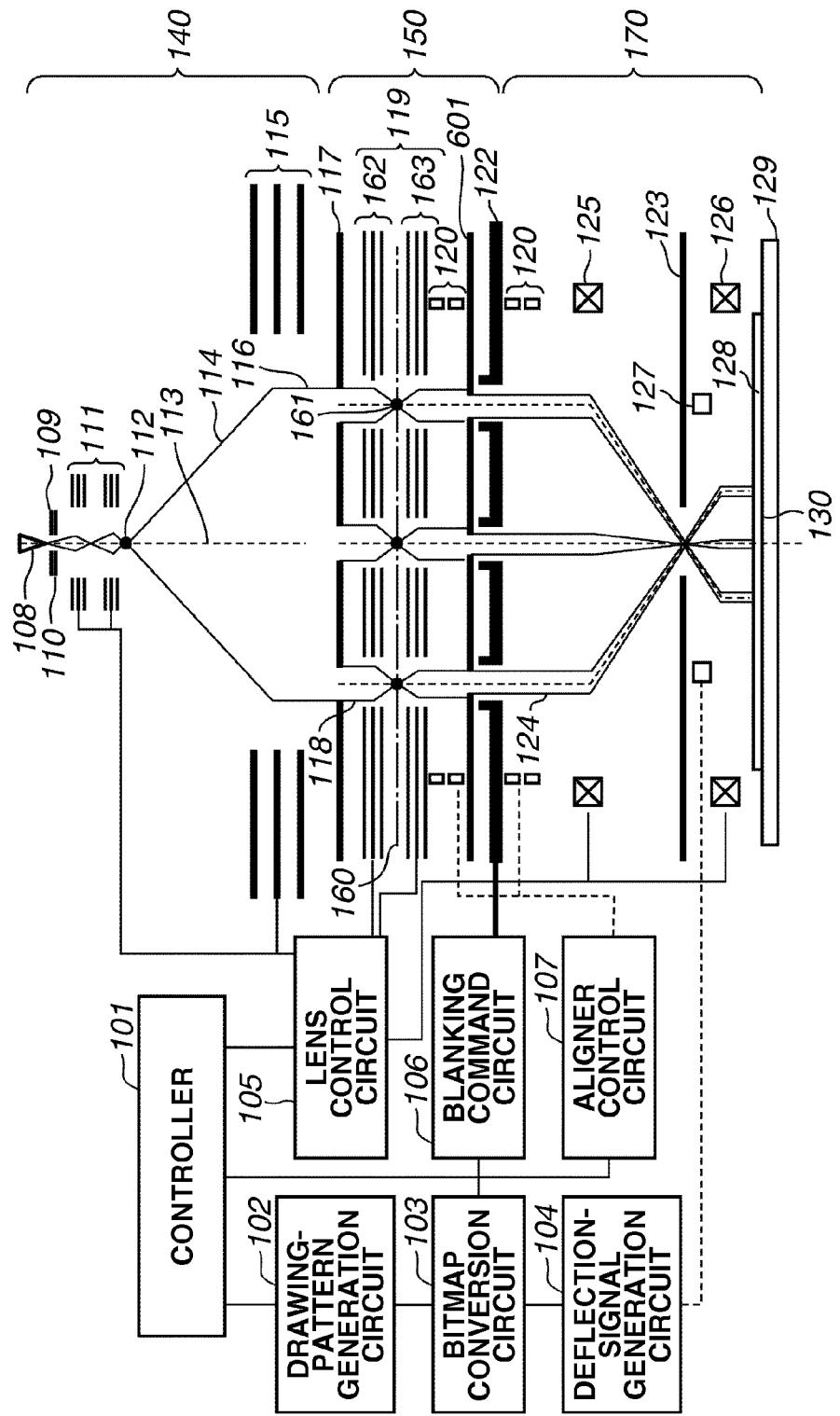
FIG. 6 is a diagram illustrating the configuration of a drawing apparatus according to a second exemplary embodiment.

FIG. 6 is a diagram illustrating a configuration of a drawing apparatus according to a second exemplary embodiment. A difference from the first exemplary embodiment is that a projection aperture array 601 is immediately above the blanker array 122. The aperture pattern of the projection aperture array 601 is reduced and projected by projection lenses of two stages, such that spots of multiple electron beams are formed on the wafer 128.

Even in this type of configuration in which an aperture pattern of apertures is reduced and projected, due to the aberration of the projection system, the same issue as that in the case of the first exemplary embodiment may occur. In other words, according the aberration (spherical aberration) of the projection system, a more outside electron beam is converged at a position closer to the electron source. Even in this case, if the correction lens array 162 and the magnifying lens array 163 are aligned with each other as described above, it is possible to make the same compensation as that in the case of the first exemplary embodiment.

Figure 7A:
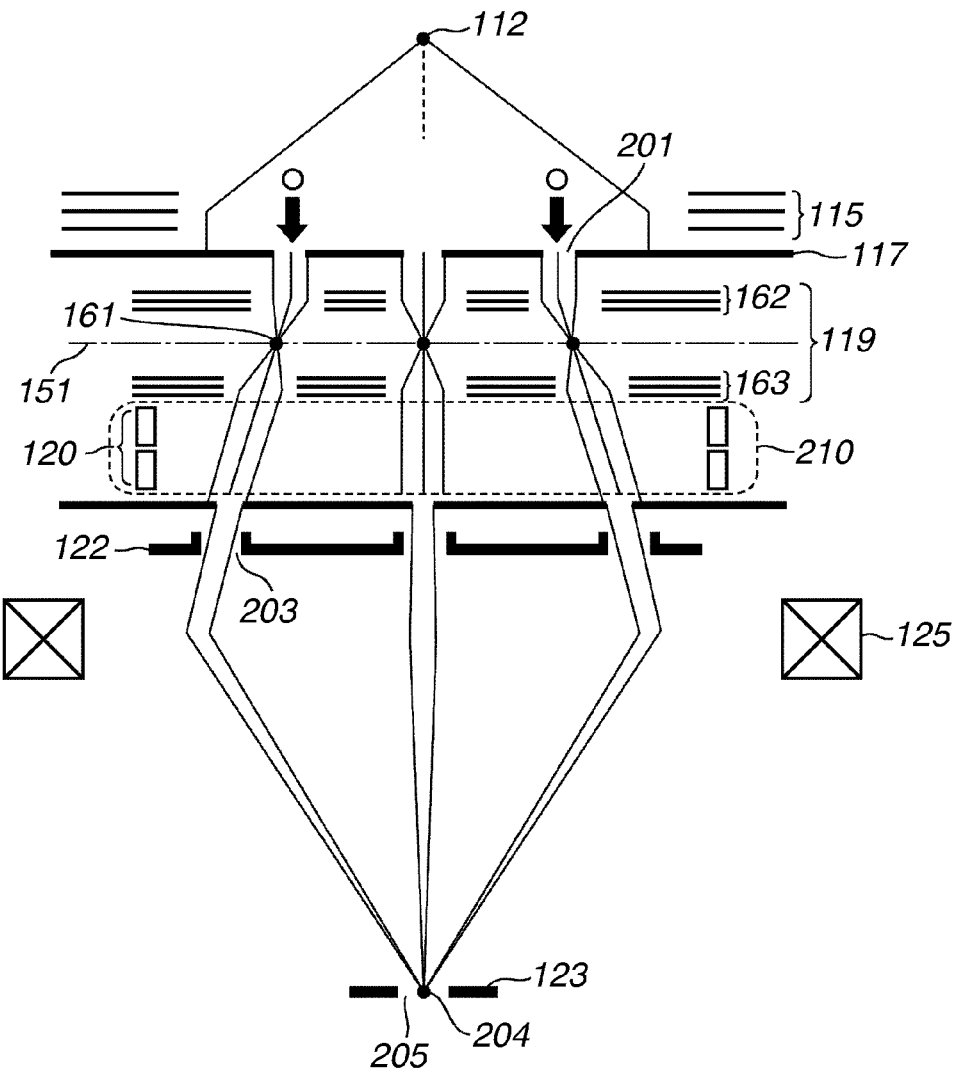
FIGS. 7A, 7B, and 7C are diagrams illustrating the configuration for compensating for non-uniformity among the plurality of charged particle beams according to the aberration of the projection system according to the second exemplary embodiment.
Figure 7B:
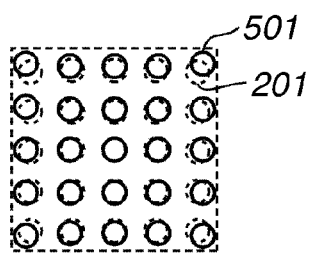
Figure 7C:
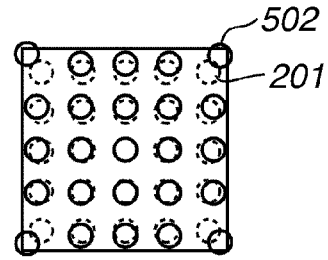

FIGS. 7A to 7C are diagrams illustrating a configuration according to the second exemplary embodiment for compensating for non-uniformity among the multiple electron beams according to the aberration of the projection system. A difference from the first exemplary embodiment is that a set of each lens of the correction lens array 162 and a corresponding lens of the magnifying lens array 163 constitutes an afocal system. In this configuration, each lens of the magnifying lens array 163 has an infinite imaging plane, and thus can be considered as a magnifying lens having infinite magnification (imaging magnification). As for the other points, the functions and configurations of the correction lens array 162 and the magnifying lens array 163 are the same as those in the first exemplary embodiment, and thus will not be described.

As illustrated in FIG. 7A, a set of each lens of the correction lens array 162 and a corresponding lens of the magnifying lens array 163 constitutes an afocal system. Therefore, each collimated electron beam group inclined such that a principal ray of a more outside electron beam is more greatly inclined outwardly is irradiated onto a corresponding aperture of a projection aperture array 610. As a result, the multiple electron beams are converged at the center position of the single aperture of the stop aperture array 123.

Until now, with respect to the compensation on the non-uniformity in the characteristics of the multiple electron beams according to the aberration of the projection optical system, the configurations for improving the compensation limit have been described. However, this compensation is not applied only on the aberration of the projection optical system, but can also be applied on the aberration of the irradiation optical system, for example. Particularly, in the case of a multi-column-type configuration having a projection unit for each of multiple electron beams, the non-uniformity in the characteristics among the multiple electron beams according to the aberration of the projection system as described above does not occur in principle. Meanwhile, in a case where the divergence angle (divergence half angle) of the electron beam from the electron source used in the irradiation optical system to increase the number of electron beams is set to be large, non-uniformity in the characteristics among the multiple electron beams according to aberration of the irradiation optical system becomes an issue. In order to implement a high-throughput drawing apparatus, it is effective to increase the number of electron beams. Therefore, in a case where the divergence angle is set to be large in the multi-column-type drawing apparatus, it becomes important for achievement of high throughput to compensate for non-uniformity in the characteristics occurring among the multiple electron beams. Hereinafter, exemplary embodiments for compensating for non-uniformity in the characteristics among the multiple electron beams according to the aberration of the irradiation optical system will be described.

Figure 8:
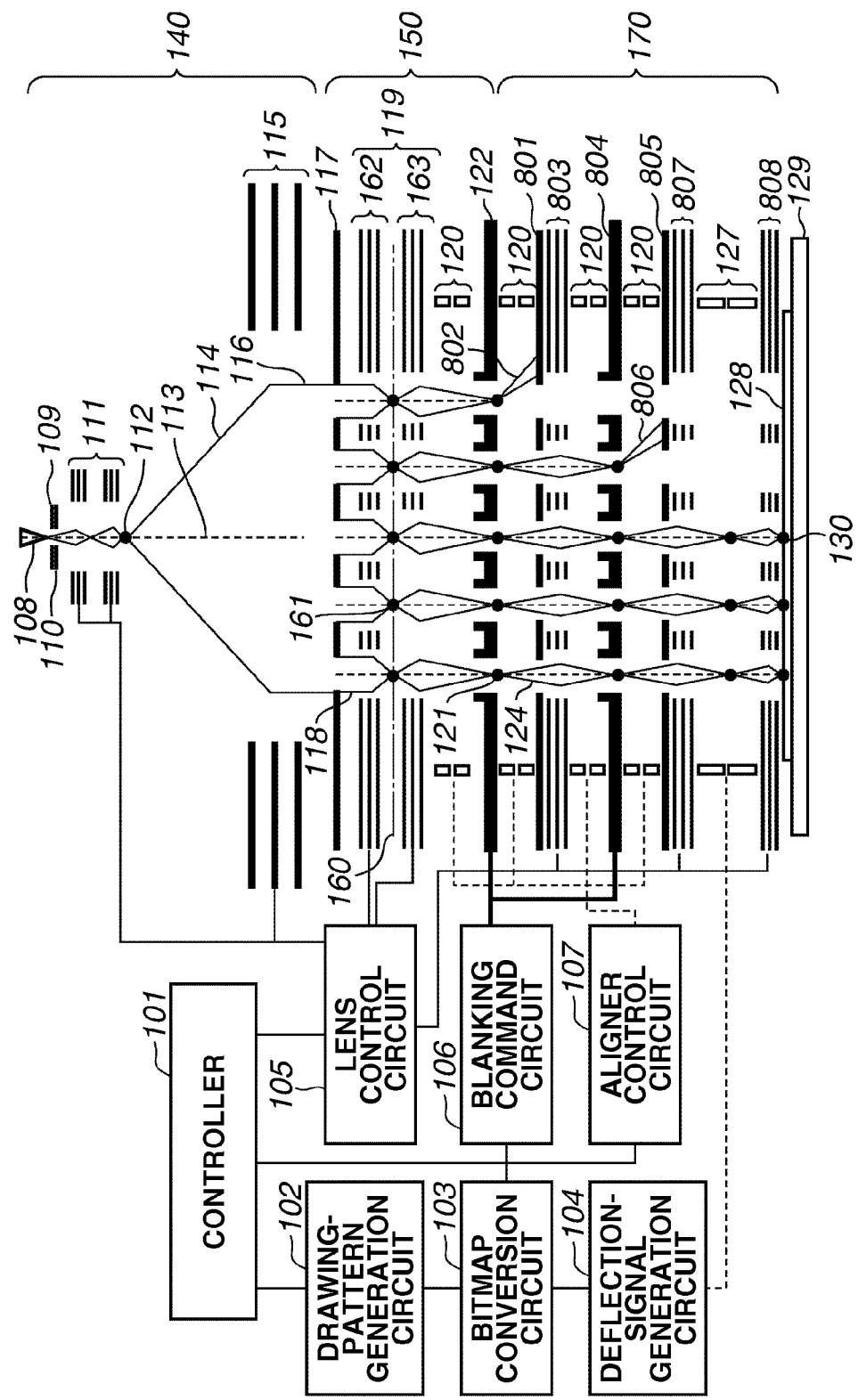
FIG. 8 is a diagram illustrating the configuration of a drawing apparatus according to a third exemplary embodiment.

FIG. 8 is a diagram illustrating a configuration of a drawing apparatus according to a third exemplary embodiment. The drawing apparatus according to the present exemplary embodiment is a multi-column-type drawing apparatus having a projection system including a projection unit for each electron beam. The similar parts to those of FIG. 1 will not be described, and in order to describe a configuration specific to the multi-column type, a configuration from the blanker array 122 will be described.

Deflection on each of the multiple electron beams is made for blanking by the blanker array 122. Electron beams deflected by the blanker array 122 are blocked by a stop aperture array 801 (blanking stop aperture array) having an aperture for each electron beam. An electron beams 802 deflected by the blanker array 122 is blocked as illustrated in FIG. 8. In the present exemplary embodiment, the blanker array is configured in two stages, and on the rear side of the blanker array 122 and the stop aperture array 801, a second blanker array 804 and a second stop aperture array 805 having the same configurations as those of the blanker array 122 and the stop aperture array 801 are disposed.

The projection system is provided for each electron beam, and includes a second covering lens array 803, a third converging lens array 807, and a fourth converging lens array 808 (objective lens array). Here, each of the second covering lens array 803, the third converging lens array 807, and the fourth converging lens array 808 may be an einzel-type electrostatic lens array, similar to the converging lens array 119. Particularly, the fourth converging lens array 808 is configured as an objective lens array, and has a projection magnification that is set to, for example, about 1/100 times. Therefore, for example, in a case where the FWHM of the electron beams on the intermediate imaging plane of the blanker array 122 is 2 μm, the FWHM on the wafer 128 becomes about 20 nm.

Similar to the first exemplary embodiment, an electron optical system includes an irradiation optical system 140, an optical system 150 for forming multiple electron beams, and a projection optical system 170. The irradiation optical system 140 includes from the electron source 108 to the collimator lens 115, and forms a collimated beam and irradiates the collimated beam onto the aperture array 117. The optical system 150 for forming multiple electron beams splits the electron beam irradiated by the irradiation optical system 140 into multiple electron beams, and forms a plurality of crossovers. The projection optical system 170 individually reduces the plurality of crossovers formed by the optical system 150 for forming multiple electron beams, and projects the plurality of crossovers onto the wafer 128. The present exemplary embodiment relates particularly to the configuration of the optical system 150 for forming multiple electron beams.

FIGS. 9A to 9C are diagrams illustrating the electron beams passing through the aperture array and the converging lens array in a case where there is non-uniformity in irradiation angles of the electron beams irradiated onto the aperture array 117 by the irradiation optical system 140. FIG. 9A mainly illustrates the optical system 150 for forming multiple electron beams illustrated in FIG. 8. In FIG. 9A, the electron beams radiated at a wide angle from the irradiation-optical-system crossover 112 is collimated by the collimator lens 115. However, in a case where an irradiation area of the irradiation optical system is large, the electron beams are not completely collimated due to the aberration of the irradiation optical system, resulting in non-uniformity in the irradiation angles. Here, the aberration of the irradiation optical system is determined by the spherical aberration of the crossover-adjustment optical system 111, the spherical aberration of the collimator lens 115, and the aberration according to space-charge effect (Coulomb effect) (can be considered as concave-lens spherical aberration) appearing between the electron source and the aperture array 117.

For example, a case where the spherical aberration of the collimator lens 115 is dominant in the above-mentioned aberration of the irradiation optical system can be considered. In this case, due to convex-lens spherical aberration (positive spherical aberration), the incident angles 204 of the electron beams to the aperture array 117 are set such that a more outside electron beam has a larger incident angle (is more greatly inclined inwardly). Similarly, the principal rays 205 of the multiple electron beams having passed through the aperture array also are inclined such that a principal ray of a more outside electron beam is more greatly inclined inwardly. Therefore, the electron beams having passed through the converging lens array 119 are shifted inward with respect to apertures 203 of the blanker array such that a more outside electron beam is more greatly shifted. As a result, non-uniformity occurs in the arrangement of the multiple electron beams, and thus outside electron beams do not pass through the centers of corresponding apertures 203 of the blanker array 122. This results in non-uniformity in the deflection characteristic of the blanker array 122.

FIG. 9B illustrates the aperture arrangements of the aperture array and the converging lens array, and FIG. 9C illustrates the arrangement of the electron beams on the imaging plane (blanker array 122). The electron beams on the imaging plane appear to be shifted according to the aberration of the irradiation optical system such that a more outside electron beam is more greatly shifted inwardly with respect to a corresponding aperture 203 of the blanker array. Here, the arrangement of the apertures 203 of the blanker array is a square lattice arrangement, for example. However, the arrangement of the apertures 203 is not limited thereto. For example, the arrangement of the apertures 203 may be other arrangements having regularity, such as a checkerboard lattice-shaped arrangement, a multi-stage checkerboard lattice-shaped arrangement, and the like.

In a case where the aberration according to the space-charge effect is dominant in the aberration of the irradiation optical system, due to the concave-lens spherical aberration (negative spherical aberration), the incident angles 204 of the electron beams to the aperture array 117 are set such that a more outside electron beam has more greatly inclined outwardly. As a result, the electron beams on the imaging plane are shifted such that a more outside electron beam is more greatly shifted outwardly.

The spherical aberration of the irradiation optical system is determined by a sum of the convex-lens spherical aberration (positive spherical aberration) based on the crossover-adjustment optical system 111 and the collimator lens 115 and the aberration according to the space-charge effect (corresponding to the concave-lens spherical aberration, that is, the negative spherical aberration). According to the spherical aberration determined as described above, whether the rays irradiated onto the aperture array are inclined inwardly or outwardly is determined, and according to this, misalignment of the beam arrangement on the imaging plane is also determined. In the third exemplary embodiment and the subsequent exemplary embodiments, it is assumed that the spherical aberration of the collimator lens 115 is dominant in the aberration of the irradiation system. In other words, a case where the incident angles 204 of the electron beams to the aperture array has non-uniformity in which a more outside electron beam is more greatly inclined inwardly will be described as an example.

FIGS. 10A to 10D are diagrams illustrating the electron beams passing the aperture array and the converging lens array in the case where there is non-uniformity in the irradiation angles of the electron beams irradiated onto the aperture array by the irradiation optical system. In FIG. 10A, the converging lens array 119 is configured in two stages including the correction lens array 162 and the magnifying lens array 163, similar to the first exemplary embodiment. First, a configuration for compensating for aberration of the irradiation optical system will be described with reference to FIG. 10A, and the advantage of this configuration will be described with reference to FIGS. 11A to 11D and FIG. 12.

In FIG. 10A, the positions of each of the apertures of the aperture array 117 and a corresponding aperture of the correction lens array 162 are shifted with respect to the position of a corresponding aperture 203 of the blanker array by the same amount. Here, the "same amount" means that a difference in shift amount is within a predetermined allowable range, that is, "substantially the same amount". The displacement amounts (shift amounts) of the apertures of the aperture array and the correction lens array are set, for example, by a function of an image height (for example, a cubic polynomial), according to the angular deviations (inclinations) of the electron beams according to the aberration of the irradiation optical system. Also, the positions of the apertures of the magnifying lens array 163 are disposed without being shifted, so as to coincide with the positions of the apertures 203 of the blanker array. Here, the term "coincidence" means that an amount of positional deviation is within a predetermined allowable range (even in the following description, the term "coincidence" will be used in the same meaning).

As described above, based on the angular deviations of the electron beams, the positions of the apertures of the aperture array 117 and the correction lens array 162 are shifted with respect to the positions of the apertures 203 of the blanker array, but the positions of the apertures of the magnifying lens array 163 are not shifted. In this case, the multiple electron beams have trajectories such that the beam arrangement on the imaging plane coincides with a target beam arrangement. If the non-uniformity in the arrangement of the multiple electron beams is compensated for such that even outside electron beams pass through the center positions of corresponding apertures 203 of the blanker array, the deflection characteristic of the blanker array 122 is improved.

FIG. 10B illustrates the arrangement of the apertures 201 of the aperture array and the arrangement of the apertures 501 of the correction lens array, and these apertures are deviated from the apertures 203 of the blanker array by the same amounts. FIG. 10C illustrates the arrangement of the apertures 502 of the magnifying lens array, and the apertures 502 of the magnifying lens array are not deviated from the apertures 203 of the blanker array. FIG. 10D illustrates the arrangement of the electron beams 121 on the imaging plane in which the positions of the electron beams 121 coincide with the positions of the apertures 203 of the blanker array, as the result of the compensation.

Here, it is useful to dispose the aperture array 117 on the pupil surface (front focal plane) of the correction lens array 162. When the aperture array 117 is on the pupil surface of the correction lens array 162, if the apertures 201 of the aperture array and the apertures 202 of the correction lens array are shifted by the same amounts, the passing areas of the electron beams at the pupil surface of the correction lens array 162 do not vary. Therefore, even if the positions of the apertures of the aperture array and the correction lens array are displaced by the same amounts while the center of each of the apertures of the aperture array is maintained coaxially with the center of a corresponding aperture of the correction lens array, it is possible to uniformly maintain the angles of the principal rays of the multiple electron beams entering the imaging plane. Consequently, if the above-mentioned compensation is made by disposing the aperture array 117 on the front focal plane of the correction lens array 162, it is possible not only to compensate for the non-uniformity in the arrangement of the multiple electron beams on the imaging plane but also to maintain the uniformity in the incident angles of the multiple electron beams to the imaging plane.

In a case where there is parallel eccentricity between the aperture array 117 and the correction lens array 162, the passing areas of all of the electron beams at the pupil surface of the correction lens array 162 vary uniformly, and thus all of the multiple electron beams are uniformly inclined at the imaging plane. These uniform inclinations can be easily and collectively compensated for by the aligner deflector 120. Since the issue is the non-uniformity occurring among the multiple electron beams, an object of the present exemplary embodiment is to reduce the non-uniformity occurring among the multiple electron beams according to the aberration of the irradiation optical system.

Subsequently, the advantage of a configuration in which the converging lens array 119 is composed of the correction lens array 162 and the magnifying lens array 163 of two stages will be described. In short, the corresponding advantage is that it is possible to improve the compensation limit with respect to compensation on the aberration of the irradiation optical system, similar to the first exemplary embodiment.

Figure 11A:
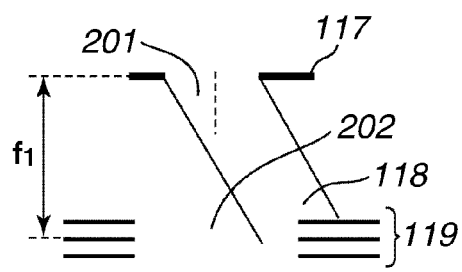
FIGS. 11A, 11B, 11C, and 11D are diagrams illustrating a relation between a focal length of a converging lens array and vignetting at the converging lens array, and an issue of an aligner installation space.
Figure 11B:
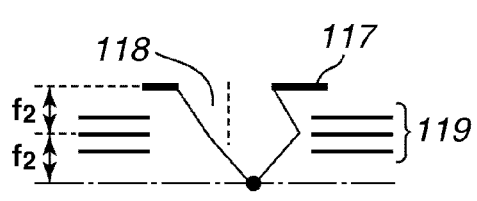

FIGS. 11A to 11D are diagrams illustrating the compensation limit with respect to the compensation on the aberration of the irradiation optical system. In a case where the aberration of the irradiation optical system is large and thus the misalignment of the irradiation angles is large, as illustrated in FIG. 11A, the electron beams having passed through the aperture array 117 are reflected by the converging lens array 119, and thus compensation is not made. In other words, even in the case of the irradiation optical system, there is a compensation limit based on vignetting by the converging lens array 119, similar to the case of the projection optical system. In order to improve this compensation limit, as illustrated in FIG. 11B, it is necessary to set the focal length of the converging lens array 119 to be short. Even in this point, the case of the irradiation optical system is similar to the case of the projection system. Reference symbol "f1" in FIG. 11A and reference symbol "f2" in FIG. 11B represent the focal lengths of the converging lens array 119 in the cases of the projection system and the irradiation optical system, respectively. The focal lengths f1 and f2 have a relation of "f1>f2".

Figure 11C:
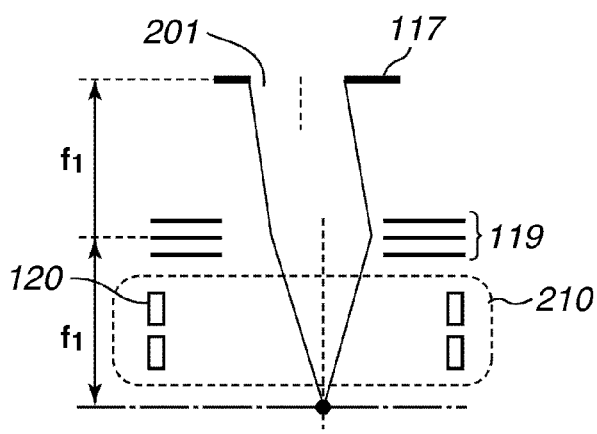
Figure 11D:
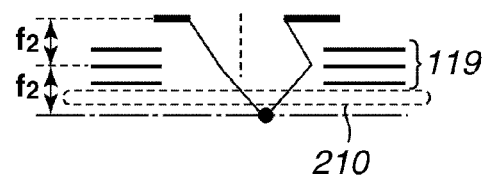

However, if setting the focal length of the converging lens array 119 to be short is performed only, the same issues as those in the case of the projection system occur. In other words, if the focal length of the converging lens array 119 is set to be short for improving the compensation limit, it is difficult to secure an installation space for the aligner deflector, and the deflection angles required for blanking increase. These points become issues. FIGS. 11C and 11D illustrate those issues. It can be seen from FIGS. 11C and 11D that if the focal length of the converging lens array 119 is set to be shorter than that in FIG. 11C, as illustrated in FIG. 11D, the installation space 210 for the aligner deflector 120 is not sufficiently secured, and the convergent angles of the electron beams on the blanker array 122 increase.

Figure 12:
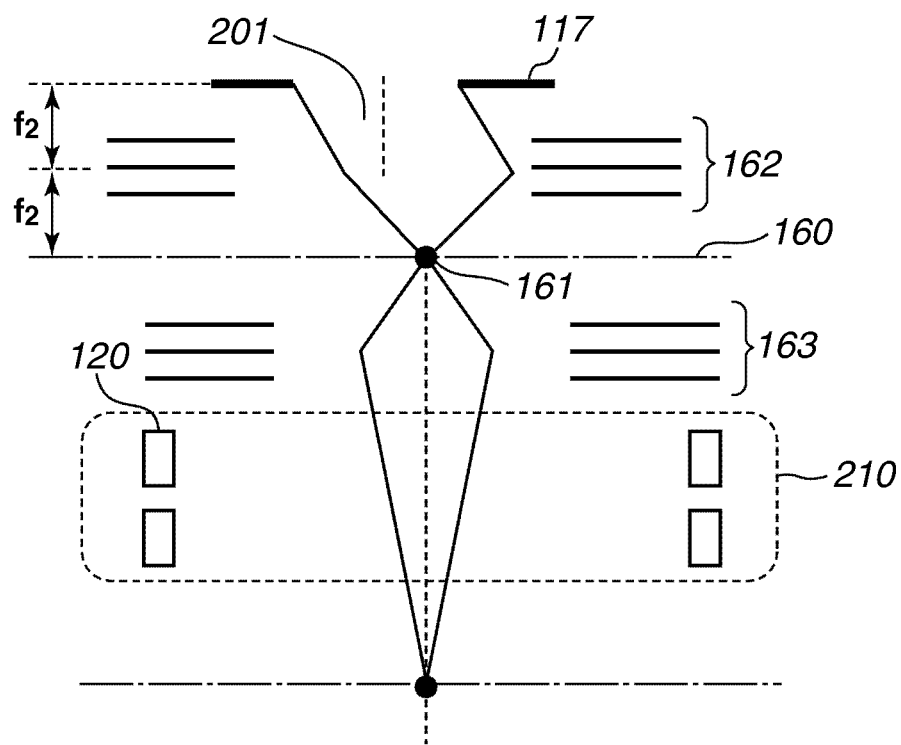
FIG. 12 is a diagram illustrating an effect of the drawing apparatus according to the third exemplary embodiment.

FIG. 12 is a diagram illustrating an effect of the drawing apparatus according to the third exemplary embodiment. It can be seen from FIG. 12 that, if the converging lens array 119 is composed of the correction lens array 162 and the magnifying lens array 163 of two stages, it is possible to solving the above-mentioned two issues while improving the compensation limit. In other words, if the magnifying lens array 163 is provided similar to the case of the first exemplary embodiment, it become possible to secure the installation space 210 for the aligner deflector, and the convergent angles of the electron beams on the blanker array 122 becomes small.

Figure 13:
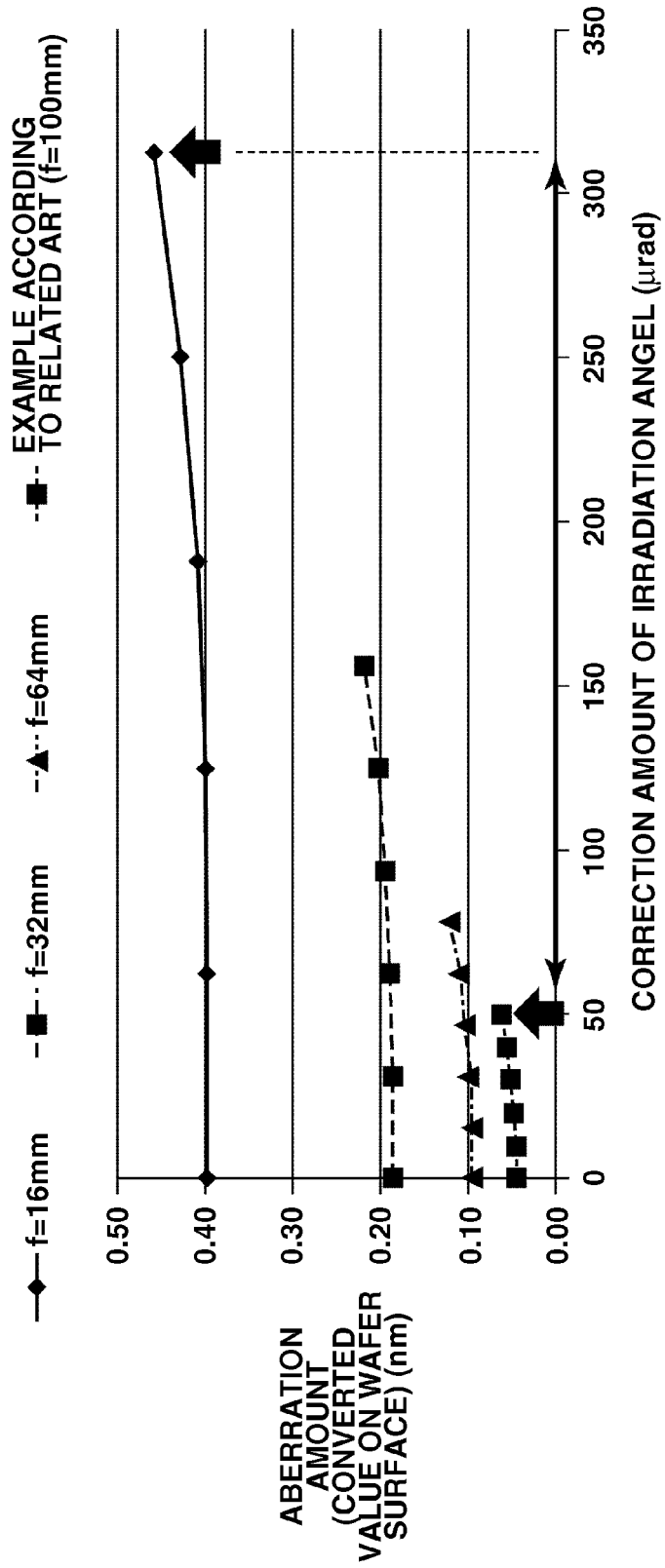
FIG. 13 is a graph illustrating the effect of the drawing apparatus according to the third exemplary embodiment.

FIG. 13 is a graph illustrating an effect of the configuration according to the third exemplary embodiment in improving the limit of compensation on the non-uniformity in the irradiation angles according to the aberration of the irradiation system. Here, a case of compensating for non-uniformity among the multiple electron beams according to the aberration of the irradiation optical system is exemplified. However, even in the cases of the first and second exemplary embodiments compensating for non-uniformity according to the aberration of the projection optical system, the same tendency is shown. The graph illustrates cases where the converging lens array 119 has a two-stage configuration, and the focal length f of the correction lens array 162 is set to 16 mm, 32 mm, and 64 mm, and a case where the converging lens array 119 has a one-stage configuration, and the focal length f is set to 100 mm. The horizontal axis represents a correction amount (μrad) of an irradiation angle, and the vertical axis represents an aberration amount (converted value on the wafer surface) (nm). The right end of each plot represents a compensation limit according to vignetting at the converging lens array. It can be seen from the graph that the two-stage configuration of the correction lens array and the magnifying lens array enables to improve the compensation limit up to about several times the compensation limit, about 50 μrad in the case of the one-stage configuration.

From the graph of FIG. 13, it can be seen that, in the case of the two-stage configuration of the correction lens array 162 and the magnifying lens array 163, the aberration increases. However, since the aberration of the optical system 150 for forming multiple electron beams is much smaller than the aberration of the projection system 170, a slight increase in the aberration of the optical system 150 for forming multiple electron beams is allowable. However, it should be noted that, as the focal length of the correction lens array 162 decreases, the aberration increases. In other words, it is necessary to note that there is a trade-off between the compensation limit and the aberration.

Subsequently, defocus adjustment for reducing the shift amounts of the apertures 201 of the aperture array and the apertures 501 of the correction lens array will be described with reference to FIGS. 14A to 14C. Here, defocus adjustment on the irradiation optical system will be described as an example. However, the same adjustment can be made even on the projection optical system in the first exemplary embodiment or the second exemplary embodiment.

In the present exemplary embodiment, specifically, the shift amounts of the apertures 201 of the aperture array and the apertures 501 of the correction lens array are determined according to an image height Y, a spherical aberration coefficient Cs of the irradiation optical system, a focal length f of the collimator lens, and an amount Δf of defocus adjustment. Here, the spherical aberration coefficient Cs of the irradiation optical system can be expressed as Cs=Cs(CO-adjust)+Cs (CL)+Cs(Coulomb). Cs (CO-adjust) represents a spherical aberration coefficient of the crossover-adjustment optical system, Cs(CL) represents a spherical aberration coefficient of the collimator lens, and Cs (Coulomb) represents a spherical aberration coefficient when the aberration according to the space-charge effect is considered as concave-lens spherical aberration. An amount Δθ of angular deviation of an electron beam according to the aberration of the irradiation optical system can be approximately expressed as $\Delta\theta = Cs(Y/f)^3 + \Delta f (Y/f)$ using the above-mentioned parameters. This equation is a cubic polynomial with respect to the image height Y.

FIGS. 14A to 14C are diagrams illustrating a difference in the aperture arrangements of the aperture array and the correction lens array between a case where defocus adjustment is made on the collimator lens and a case where defocus adjustment is not made on the collimator lens in the present exemplary embodiment. FIG. 14A illustrates the arrangement of the apertures 201 of the aperture array and the arrangement of the apertures 501 of the correction lens array in a case where the amount Δf of defocus adjustment is 0. FIG. 14B illustrates the arrangement of the apertures 201 of the aperture array and the arrangement of the apertures 501 of the correction lens array in a case where defocus adjustment is made. FIG. 14C is a graph having a horizontal axis representing the image height Y (irradiation position) and a vertical axis representing an amount of angular deviation of an electron beam (which is considered as positive when the electron beam is inclined inwardly) according to the aberration of the irradiation optical system and illustrating a case where Cs is 5000 mm, f is 500 mm, and Δf is 1.5 mm.

In FIG. 14C, an amount of angular deviation of each electron beam in the case where defocus adjustment is not made is proportional to the cubic of the image height Y. Therefore, the shift amounts of the positions of the apertures of the aperture array and the correction lens array are made proportional to the cubic of the image height Y, as illustrated in FIG. 14A. Meanwhile, in FIG. 14C, the amount of angular deviation of each electron beam in a case where defocus adjustment is made is expressed by a sum of a term proportional to the cubic of the image height Y and a defocus term proportional to the image height Y. For this reason, as can be seen from FIG. 14C, the amount of angular deviation of each electron beam in a case where defocus adjustment is made is negative in an area where the image height Y is small, and is positive in an area where the image height Y is large. Therefore, in this case, in the area where the image height is small, it is necessary to shift the apertures of the aperture array and the correction lens array inward with respect to the apertures 203 of the blanker array, as illustrated in FIG. 14B, (see apertures 1401). Also, in the area where the image height is large, it is necessary to shift the apertures of the aperture array and the correction lens array outward (see apertures 1402).

As described above, in a case where defocus adjustment is made, the aperture arrangements of the aperture array and the correction lens array becomes slightly complicated. However, as apparent from FIG. 14C, a range of the absolute value of the amount of angle deviation of the electron beams in a case where the defocus adjustment is made becomes relatively small. In other words, in a case where defocus adjustment is made, there is an advantage that it is possible to reduce the shift amounts of the apertures of the aperture array and the correction lens array. This can be well understood by comparison between FIGS. 14A and 14B.

As described above, each of a case where the defocus adjustment is made and a case where the defocus adjustment is not made has the advantage and the disadvantage. Further, in all exemplary embodiments of the invention including the present exemplary embodiment, the aperture arrangements of the aperture array and the correction lens array may be changed by the defocus adjustment. However, the aperture arrangements illustrated in the exemplary embodiments are merely illustrative. In other words, the configuration in which the non-uniformity among the multiple electron beams depending on the aberration of an optical system is compensated for by lens arrays of multiple stages having different aperture arrangements although it is necessary to change the corresponding aperture arrangements according to the defocus adjustment is common to all of the exemplary embodiments.

Figure 15:
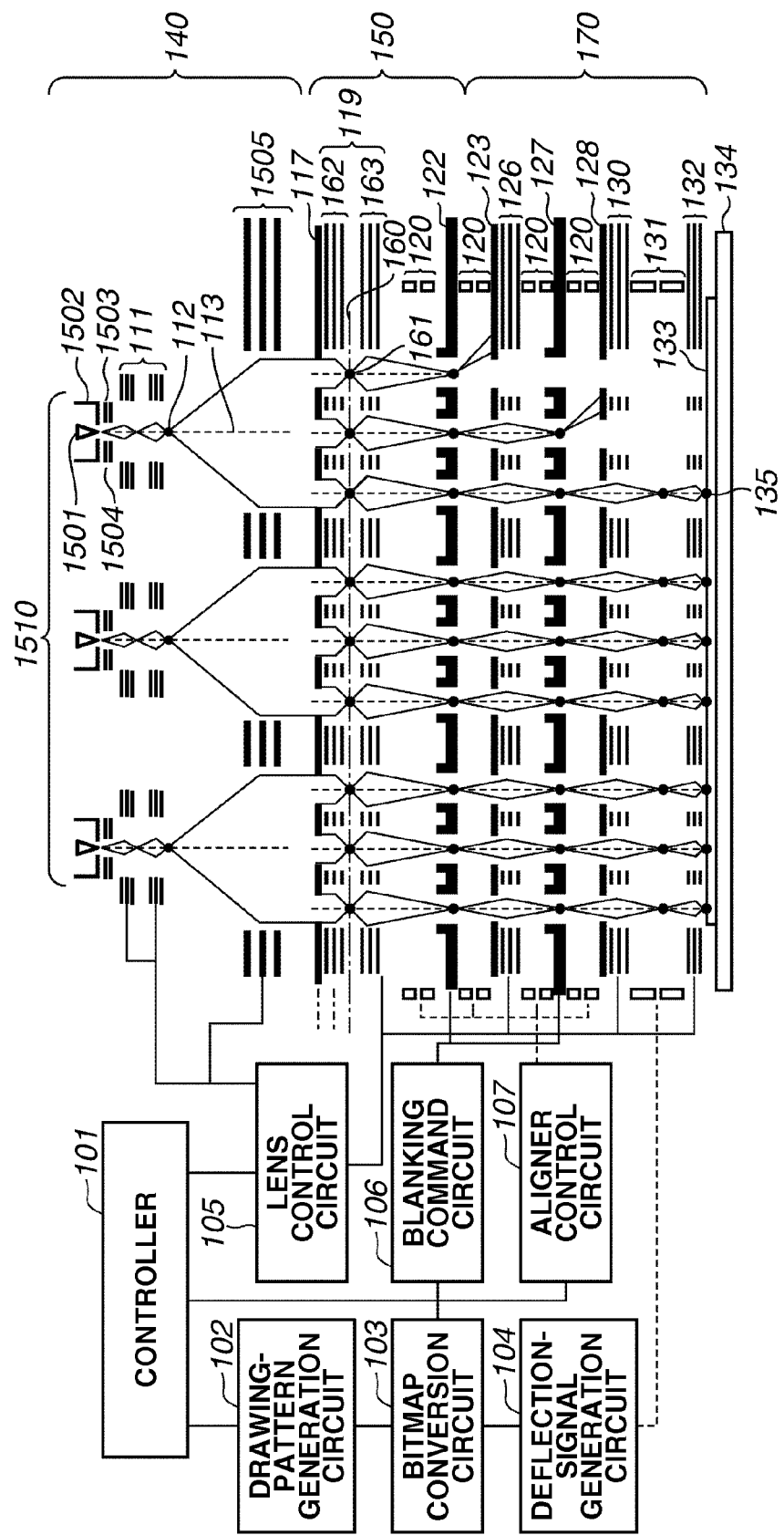
FIG. 15 is a diagram illustrating the configuration of a drawing apparatus according to a fourth exemplary embodiment.

FIG. 15 is a diagram illustrating a configuration of a drawing apparatus according to a fourth exemplary embodiment. Only an electron source array 1510 and a portion of the optical system 150 for forming multiple electron beams configured differently from the drawing apparatus (according to the third exemplary embodiment) illustrated in FIG. 8 will be described. The electron source array 1510 is configured by arranging a plurality of thermal field-emission (TFE) electron sources (electron guns). Electron beam groups emitted from TFE emitters 1501 having an array arrangement form (irradiation-optical-system) crossovers 112 having a similar array arrangement by crossover-adjustment optical systems 111 having a similar array arrangement. Here, the TFE emitters 1501 can use a cathode material such as ZrO/W appropriate for field emission.

A plurality of electron beams 114 radiated from the irradiation-optical-system crossovers 112 having the array arrangement are collimated by a collimator lens array 1505, respectively, so as to become a plurality of electron beams that do not overlap one other. Next, each electron beam is irradiated onto a sub array area on the aperture array 117. In the present exemplary embodiment, it is assumed that the sub array areas are 9 (3-by-3) sub array areas. As can be seen from FIGS. 11A to 11D, if focusing only on one electron source of the electron source array 1510, a configuration of a corresponding electron optical system is equivalent to the configuration illustrated in FIG. 8. In other words, in the present exemplary embodiment, a plurality of sets each of which includes an irradiation optical system, an aperture array, a lens array, and projection units is configured in parallel. Therefore, the compensation described in the third exemplary embodiment can be made in parallel in the plurality of electron optical systems provided for the sub array areas.

FIG. 16A illustrates aperture arrangements of aperture arrays and correction lens arrays in 3-by-3 sub array areas, FIG. 16B illustrates aperture arrangements of corresponding magnifying lens arrays, and FIG. 16C illustrates beam arrangements on an imaging plane. As illustrated in FIG. 16A, in each sub array area, the apertures 201 of the aperture array and the apertures 501 of the correction lens array are deviated from the apertures 203 of the blanker array for compensating for non-uniformity in the angles of the electron beams according to the aberration of the irradiation optical system. Meanwhile, as illustrated in FIG. 16B, the apertures 502 of the magnifying lens array are not deviated from the apertures 203 of the blanker array.

In a case where the same irradiation optical systems are configured in parallel, the aperture arrangements of the aperture array and the correction lens array may be common to all of sub arrays. In FIG. 16A, the aperture array 117 is disposed on the front focal plane of the converging lens array, and the apertures 201 of the aperture array and the apertures 202 of the converging lens array are shifted by the same amounts.

If the compensation according to the third exemplary embodiment is applied for each sub array as illustrated in FIG. 16A, the non-uniformity among the multiple electron beams can be compensated for as illustrated in FIG. 16C. In a case where an irradiation optical system is provided for each sub array as described above, it is important that it is possible to perform compensation on each sub array. Therefore, for example, in a case where defocus adjustment of each collimator lens is made, apparently, it is necessary to apply the aperture arrangements of the aperture array and the correction lens array as illustrated in FIGS. 14A to 14C, to aperture arrangements for sub array.

Figure 17:
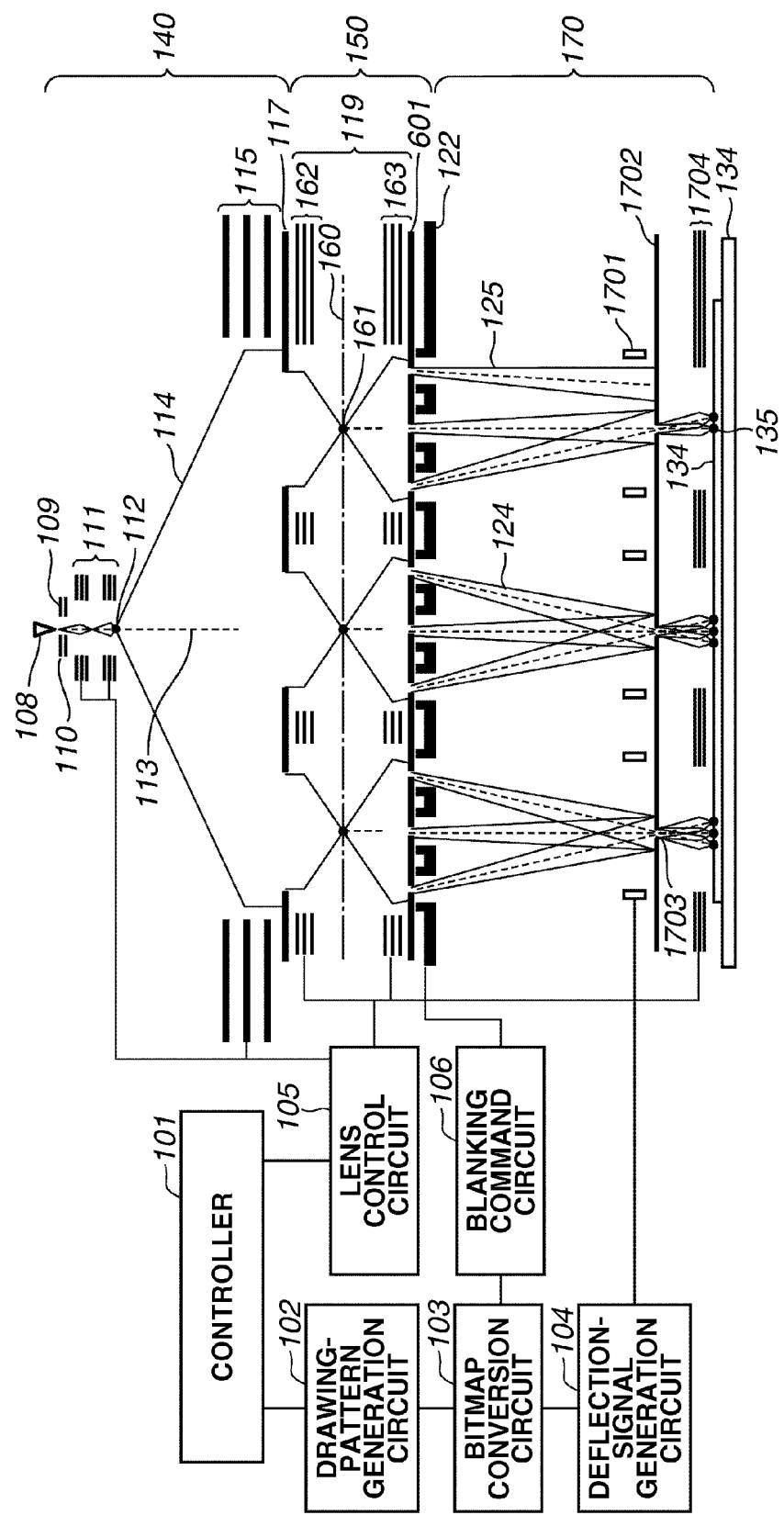
FIG. 17 is a diagram illustrating the configuration of a drawing apparatus according to a fifth exemplary embodiment.

FIG. 17 is a diagram illustrating a configuration of a drawing apparatus according to a fifth exemplary embodiment. In FIG. 17, an upper portion from the electron source 108 to the aperture array 117 have the same configuration as the configuration of the drawing apparatus (according to the third exemplary embodiment) illustrated in FIG. 8, and thus a redundant description will not be repeated and a configuration on the rear side of the aperture array 117 will be described.

The multiple electron beams formed by the aperture array 117 form images (crossovers) on an intermediate imaging plane 160 by the correction lens array 162, and are converged again by the magnifying lens array 163. In the fifth exemplary embodiment, the lens power of the magnifying lens array 163 is set such that the multiple beams are converged at apertures 1703 on a rear-side stop aperture array 1702.

The multiple electron beams having passed through the magnifying lens array 163 are immediately split again by a projection aperture array 601. FIG. 17 illustrates a case where each electron beam is split into 3-by-3 electron beams (multiple sub electron beam groups).

The multiple sub electron beam groups are converged on the stop aperture array 1702 by setting of the lens power of the magnifying lens array 163. Here, the stop aperture array 1702 has an aperture for each sub electron beam group. Further, the arrangement of the apertures 1703 of the stop aperture array 1702 coincide with the arrangement of the central apertures of the 3-by-3 sub aperture array of the projection aperture array 601.

Immediately below the projection aperture array 601, the blanker array 122 is provided such that the electron beams can be individually deflected for blanking. In a case where it is desired to blank an electron beam, a voltage is applied to corresponding electrodes of the blanker array 122 such that the corresponding electron beam is blocked by the stop aperture array 1702. An electron beam 125 deflected by the blanker array is illustrated as an example in FIG. 17.

The multiple sub electron beam groups having passed through the stop aperture array 1702 are converged by a second converging lens array 1704, to form images on the surface of the wafer 128. The projection aperture array 601 serves as an object plane of the second covering lens array, and 3-by-3 sub aperture arrays of the projection aperture array 601 reduce electron beams and project the electron beams onto the surface of the wafer 128. The size of the apertures of the projection aperture array 601 is, for example, 2.5 μm, and the projection magnification of the second converging lens array 1704 is, for example, 1/100 times. In this case, the electron beams projected on the surface of the wafer 128 have a beam diameter of 25 nm.

Further, the stop aperture array 1702 is disposed at the position of the front focal plane of the second converging lens array 1704, and defines the passing areas of the electron beams at the pupil surface of the second converging lens array 1704. In the vicinity of the stop aperture array 1702, a deflection array 1701 is disposed to make it possible to perform scanning with the multiple electron beams. Each pair of electrodes of the deflection array 1701 may be driven by a common application voltage to avoid complication of the apparatus. Also, the structure of each pair of electrodes may be a pair of comb-teeth-shaped electrodes.

Figure 18A:
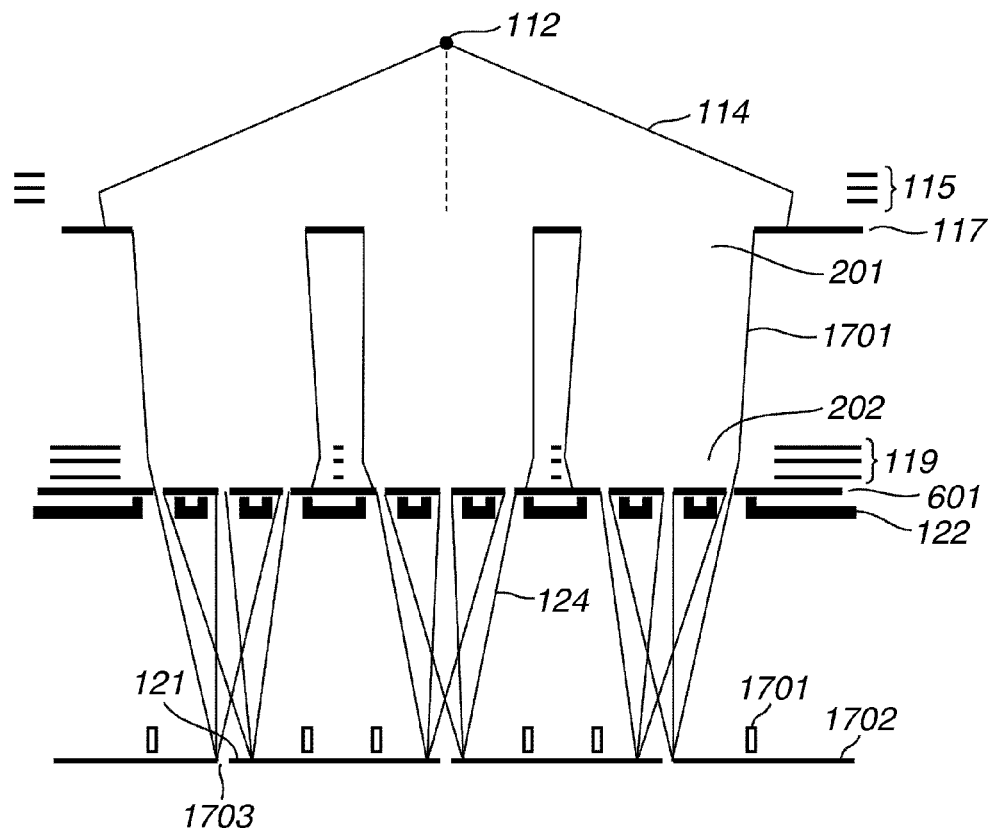
FIGS. 18A, 18B, and 18C are diagrams illustrating charged particle beams passing through an aperture array and a converging lens array, aperture arrangements of the aperture array and the converging lens array, and an arrangement of the charged particle beams on an imaging plane, in a case where irradiation angles are non-uniform.
Figure 18B:
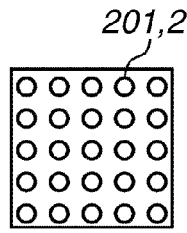
Figure 18C:
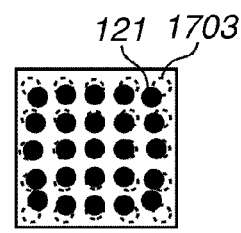

FIGS. 18A to 18C are diagrams illustrating the electron beams passing through the aperture array and the converging lens array, and the arrangement of electron beams on the stop aperture array, in a case where there is non-uniformity in the irradiation angles of the electron beams irradiated onto the aperture array 117. In a case where there is non-uniformity in the irradiation angles of the electron beams according to the aberration of the irradiation optical system, as described above, non-uniformity occurs in the arrangement of the electron beams converged by the converging lens array 119. In the case of the present exemplary embodiment, the imaging plane of the converging lens array 119 is the stop aperture array 1702, and thus the arrangement of the sub electron beams on the stop aperture array 1702 becomes non-uniform by the aberration of the irradiation optical system. This arrangement is illustrated in FIG. 18C. Similar to the case of FIG. 9C, non-uniformity in which a more outside electron beam reaches (is converged at) an inner position than the position of a corresponding aperture 1703 of the stop aperture array occurs.

In the present exemplary embodiment, since the multiple electron beams are further split by the projection aperture array 601, it is necessary to newly consider an effect of the inclinations of the electron beams irradiated onto the projection aperture array 601. As can be seen from FIGS. 18A to 18C, the electron beams irradiated onto the projection aperture array 601 are inclined by the aberration of the irradiation optical system such that a more outside electron beam is more greatly inclined inwardly. As a result, the principal rays of each of the multiple sub electron beam groups are inclined such that a more outside electron beam is more greatly inclined inwardly (this can be seen by comparing the central sub electron beam group with the left or right sub electron beam group in FIG. 18A). Therefore, a distribution of the angles of the electron beams defined by apertures 1703 of the stop aperture array depends on each sub electron beam group. As a result, non-uniformity occurs in the arrangement of the electron beams and the current intensities of the electron beams on the surface of the wafer 128.

Figure 19A:
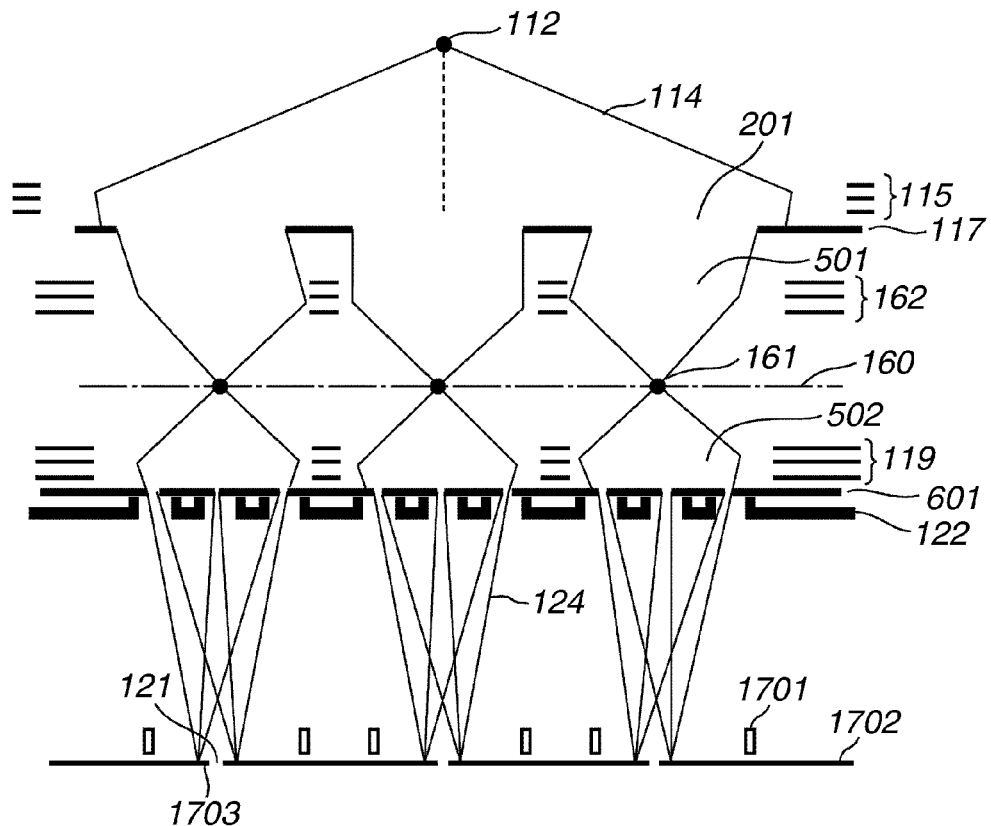
FIGS. 19A, 19B, 19C, and 19D are diagrams illustrating the configuration for compensating for non-uniformity among a plurality of charged particle beams according to aberration of an irradiation system according to the fifth exemplary embodiment.
Figure 19B:
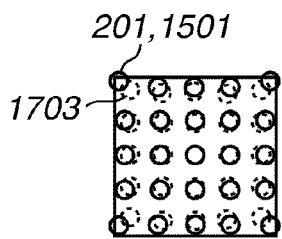
Figure 19C:
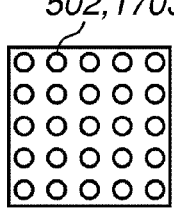
Figure 19D:
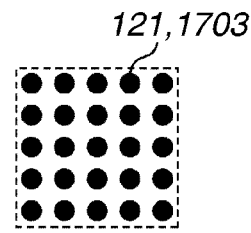

FIGS. 19A to 19D are diagrams illustrating the electron beams passing through the aperture array, the correction lens array, and the magnifying lens array, and the arrangement of the electron beams on the stop aperture array, in a case where there is non-uniformity in the irradiation angles of the electron beams in the configuration of the present exemplary embodiment. As illustrated in FIG. 19B, the positions of the apertures 201 of the aperture array and the apertures 501 of the correction lens array are deviated from the positions of the apertures 1703 of the stop aperture array according to a cubic polynomial with respect to the image height. Meanwhile, the positions of the apertures 502 of the magnifying lens array coincide with the positions of the apertures 1703 of the stop aperture array. In other words, in the third exemplary embodiment, the apertures 203 of the blanker array are reference apertures of the configuration, whereas in the present exemplary embodiment, the apertures 1703 of the stop aperture array are reference apertures.

According to the configuration of the present exemplary embodiment illustrated in FIGS. 19A to 19D, it is possible to compensate for aberration of the irradiation optical system such that the multiple sub electron beam groups are converged at the centers of the apertures 1703 of the stop aperture array without shifting the inclination angle of each of the principal rays of the multiple sub electron beams. Further, similar to the cases of the other exemplary embodiments, it is possible to improve the compensation limit by configuring the converging lens array 119 to include electrostatic lens arrays of two stages of the correction lens array 162 and the magnifying lens array 163.

A method of manufacturing an article according to an exemplary embodiment is suitable for manufacturing articles, for example, micro devices such as semiconductor devices, elements having fine configurations, and the like. The corresponding manufacturing method may include a process of forming a latent image pattern on a photosensitive material applied to a substrate by using the above-mentioned drawing apparatus (a process of performing drawing on a substrate), and a process of developing the substrate having the latent image pattern formed thereon. Further, the corresponding manufacturing method may include other processes (such as oxidation, film formation, vapor deposition, doping, planarizing, etching, resist removing, dicing, bonding, packaging, and the like). The method of manufacturing an article according to the present exemplary embodiment is advantageous in at least one of the performance, quality, productivity, and production cost of the article, as compared to methods according to the related art.

Although the exemplary embodiments have been described above, the invention is not limited to the exemplary embodiments, but can be modified and changed within the scope of the gist of the invention. For example, it is possible to shift the apertures of the converging lens array without shifting the apertures of the aperture array. In this way, the positions of the crossovers to be formed by the converging lens array can be aligned with (the centers of) the apertures of a rear-side element such as the blanker array or the stop aperture array. However, in this configuration, the principal rays of the electron beams entering the apertures of the corresponding element are not parallel to an optical axis, and thus this point needs to be noted. This configuration is usable, for example, in a case where the angular deviation of the principal rays as described above is allowable or a case where an optical element configured to compensate for the corresponding angle deviation is separately added.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-109449 filed May 16, 2011, which is hereby incorporated by reference herein in its entirety.

What is claimed is:

1. A drawing apparatus configured to perform drawing on a substrate with a plurality of charged particle beams, the apparatus comprising:

an irradiation system including a collimator lens on which a diverging charged particle beam is incident;

an aperture array configured to split the charged particle beam from the collimator lens into the plurality of charged particle beams;

a lens array configured to form a plurality of crossovers of the plurality of charged particle beams from the aperture array; and a projection system including an element having a single aperture and configured to converge the plurality of charged particle beams corresponding to the plurality of crossovers and to project the plurality of charged particle beams having passed through the single aperture onto the substrate, wherein the lens array includes a correction lens array and a magnifying less array, the correction lens array including a converging lens eccentric relative to corresponding one of a plurality of apertures of the aperture array such that the plurality of charged particle beams converged according to aberration of the projection system are converged to the single aperture, and the magnifying lens array configured, so as to form the plurality of crossovers, to magnify a plurality of crossovers formed by the correction lens array, converging lenses included in the correction lens array having such focal lengths that the eccentric converging lens refracts a charged particle beam corresponding thereto, without shielding of the charged particle beam, so that the plurality of charged particle beams are converged to the single aperture, magnifying lenses included in the magnifying lens array having such focal lengths that the magnifying lenses respectively converge a plurality of charged particle beams, respectively converged by the converging lenses and then diverged, with convergent angles smaller than convergent angles of the plurality of charged particle beams respectively converged by the converging lenses.

2. The drawing apparatus according to claim 1, wherein the magnifying lens array includes a magnifying lens eccentric relative to corresponding one of the plurality of apertures of the aperture array such that a principal ray of a charged particle beam having passed through the converging lens passes through a center of the magnifying lens.

3. The drawing apparatus according to claim 1, wherein a magnifying lens included in the magnifying lens array is configured to have infinite magnification.

4. The drawing apparatus according to claim 1, further comprising:
an aligner deflector configured to deflect the plurality of charged particle beams between the plurality of crossovers formed by the lens array and the magnifying lens array, to adjust positions of the plurality of crossovers.

5. A drawing apparatus configured to perform drawing on a substrate with a plurality of charged particle beams, the apparatus comprising:
an irradiation system including a collimator lens on which a diverging charged particle beam is incident;
an aperture array configured to split the charged particle beam from the collimator lens into the plurality of charged particle beams;
a lens array configured to form a plurality of crossovers of the plurality of charged particle beams from the aperture array; and
a projection system including an element having a plurality of apertures corresponding to the plurality of crossovers, and a plurality of projection units corresponding to the plurality of apertures and configured to project the plurality of charged particle beams from the plurality of apertures onto the substrate,
wherein the lens array includes a correction lens array and a magnifying lens array, the correction lens array including a converging lens eccentric relative to corresponding one of the plurality of apertures of the element so as to align each of the plurality of crossovers formed via the aperture array, on which the charged particle beam is incident at incident angles according to aberration of the irradiation system, and via the lens array, with corresponding one of the plurality of apertures of the element, and the magnifying lens array configured, so as to form the plurality of crossovers, to magnify a plurality of crossovers formed by the correction lens array, converging lenses included in the correction lens array having such focal lengths that the eccentric converging lens refracts a charged particle beam corresponding thereto, without shielding of the charged particle beam, so that each of the plurality of charged particle beams is aligned with corresponding one of the plurality of apertures of the element, magnifying lenses included in the magnifying lens array having such focal lengths that the magnifying lenses respectively converge a plurality of charged particle beams, respectively converged by the converging lenses and then diverged, with convergent angles smaller than convergent angles of the plurality of charged particle beams respectively converged by the converging lenses.

6. The drawing apparatus according to claim 5, wherein an arrangement of magnifying lenses of the magnifying lens array is aligned with an arrangement of the plurality of apertures of the element.

7. The drawing apparatus according to claim 5, wherein the aperture array includes an aperture eccentric relative to the corresponding one of the plurality of apertures of the element with the converging lens.

8. The drawing apparatus according to claim 7, wherein the aperture array is disposed on a front focal plane of the correction lens array, and includes an aperture eccentric relative to the corresponding one of the plurality of apertures of the element by the same amount as that of the converging lens.

9. The drawing apparatus according to claim 5, wherein the collimator lens receives the charged particle beam from a crossover, deviating from a front focal plane of the collimator lens, of a charged particle beam.

10. The drawing apparatus according to claim 5, comprising:
a plurality of groups arranged in parallel, each group including the irradiation system, the aperture array, the lens array, and the projection system.

11. The drawing apparatus according to claim 5, wherein the element includes a blanking deflector array.

12. The drawing apparatus according to claim 5, wherein the element includes a blanking stop aperture array.

13. A method of manufacturing an article, the method comprising:
performing drawing on a substrate using a drawing apparatus;
developing the substrate on which the drawing has been performed; and
processing the developed substrate to manufacture the article,
wherein the drawing apparatus is configured to perform drawing on the substrate with a plurality of charged particle beams, the apparatus comprises:
an irradiation system including a collimator lens on which a diverging charged particle beam is incident;
an aperture array configured to split the charged particle beam from the collimator lens into the plurality of charged particle beams;
a lens array configured to form a plurality of crossovers of the plurality of charged particle beams from the aperture array; and
a projection system including an element having a single aperture and configured to converge the plurality of charged particle beams corresponding to the plurality of crossovers and to project the plurality of charged particle beams having passed through the single aperture onto the substrate,
wherein the lens array includes a correction lens array and a magnifying less array, the correction lens array including a converging lens eccentric relative to corresponding one of a plurality of apertures of the aperture array such that the plurality of charged particle beams converged according to aberration of the projection system are converged to the single aperture, and the magnifying lens array configured, so as to form the plurality of crossovers, to magnify a plurality of crossovers formed by the correction lens array, converging lenses included in the correction lens array having such focal lengths that the eccentric converging lens refracts a charged particle beam corresponding thereto, without shielding of the charged particle beam, so that the plurality of charged particle beams are converged to the single aperture, magnifying lenses included in the magnifying lens array having such focal lengths that the magnifying lenses respectively converge a plurality of charged particle beams, respectively converged by the converging lenses and then diverged, with convergent angles smaller than convergent angles of the plurality of charged particle beams respectively converged by the converging lenses.

14. A method of manufacturing an article, the method comprising:

performing drawing on a substrate using a drawing apparatus;

developing the substrate on which the drawing has been performed; and processing the developed substrate to manufacture the article, wherein the drawing apparatus is configured to perform drawing on the substrate with a plurality of charged particle beams, the apparatus comprises:

an irradiation system including a collimator lens on which a diverging charged particle beam is incident;

an aperture array configured to split the charged particle beam from the collimator lens into the plurality of charged particle beams;

a lens array configured to form a plurality of crossovers of the plurality of charged particle beams from the aperture array; and a projection system including an element having a plurality of apertures corresponding to the plurality of crossovers, and a plurality of projection units corresponding to the plurality of apertures and configured to project the plurality of charged particle beams from the plurality of apertures onto the substrate, wherein the lens array includes a correction lens array and a magnifying lens array, the correction lens array including a converging lens eccentric relative to corresponding one of the plurality of apertures of the element so as to align each of the plurality of crossovers formed via the aperture array, on which the charged particle beam is incident at incident angles according to aberration of the irradiation system, and via the lens array, with corresponding one of the plurality of apertures of the element, and the magnifying lens array configured, so as to form the plurality of crossovers, to magnify a plurality of crossovers formed by the correction lens array, converging lenses included in the correction lens array having such focal lengths that the eccentric converging lens refracts a charged particle beam corresponding thereto, without shielding of the charged particle beam, so that each of the plurality of charged particle beams is aligned with corresponding one of the plurality of apertures of the element, magnifying lenses included in the magnifying lens array having such focal lengths that the magnifying lenses respectively converge a plurality of charged particle beams, respectively converged by the converging lenses and then diverged, with convergent angles smaller than convergent angles of the plurality of charged particle beams respectively converged by the converging lenses.

\* \* \* \* \*